United States Patent
Ha et al.

(10) Patent No.: US 12,483,840 B2
(45) Date of Patent: *Nov. 25, 2025

(54) VIBRATION DEVICE AND APPARATUS INCLUDING THE SAME

(71) Applicant: LG Display Co., Ltd., Seoul (KR)

(72) Inventors: YoungWook Ha, Paju-si (KR); SeungRyull Park, Paju-si (KR); Chiwan Kim, Paju-si (KR); Sungwook Ko, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 55 days.

This patent is subject to a terminal disclaimer.

(21) Appl. No.: 18/411,775

(22) Filed: Jan. 12, 2024

(65) Prior Publication Data
US 2024/0196135 A1 Jun. 13, 2024

Related U.S. Application Data

(63) Continuation of application No. 17/555,091, filed on Dec. 17, 2021, now Pat. No. 11,910,158.

(30) Foreign Application Priority Data

Dec. 31, 2020 (KR) .................. 10-2020-0189825

(51) Int. Cl.
| | | |
|---|---|---|
| *H04R 17/00* | (2006.01) | |
| *H10N 30/85* | (2023.01) | |
| *H10N 30/87* | (2023.01) | |
| *H10N 30/88* | (2023.01) | |

(52) U.S. Cl.
CPC ........... *H04R 17/00* (2013.01); *H10N 30/852* (2023.02); *H10N 30/877* (2023.02); *H10N 30/883* (2023.02); *H04R 2499/13* (2013.01); *H04R 2499/15* (2013.01)

(58) Field of Classification Search
None
See application file for complete search history.

(56) References Cited

U.S. PATENT DOCUMENTS

| | | | |
|---|---|---|---|
| 11,910,158 B2* | 2/2024 | Ha | H04R 17/005 |
| 2010/0296677 A1 | 11/2010 | Jiang et al. | |
| 2015/0022940 A1* | 1/2015 | Han | H01G 4/30 |
| | | | 252/514 |
| 2015/0207148 A1* | 7/2015 | Kimura | H01G 11/26 |
| | | | 429/217 |
| 2020/0209973 A1 | 7/2020 | Kim et al. | |

(Continued)

FOREIGN PATENT DOCUMENTS

| | | |
|---|---|---|
| CN | 111381672 A | 7/2020 |
| CN | 111381724 A | 7/2020 |
| JP | 2010-273330 A | 12/2010 |

(Continued)

*Primary Examiner* — Walter F Briney, III
(74) *Attorney, Agent, or Firm* — Birch, Stewart, Kolasch & Birch, LLP

(57) ABSTRACT

A vibration device can include a vibration portion, a first electrode portion disposed on a first surface of the vibration portion, and a second electrode portion disposed on a second surface of the vibration portion. Also, each of the first electrode portion and the second electrode portion includes a conductive metal particle and a piezoelectric nanoparticle.

39 Claims, 22 Drawing Sheets

(56) References Cited

U.S. PATENT DOCUMENTS

2020/0319842 A1\* 10/2020 Lee ..................... G06F 1/1605

FOREIGN PATENT DOCUMENTS

| KR | 10-2007-0082087 A | | 8/2007 |
|----|-------------------|---|--------|
| KR | 10-1462798 B1 | | 11/2014 |
| KR | 101635815 B1 | * | 7/2016 |
| KR | 10-2017-0115124 A | | 10/2017 |
| KR | 10-2020-0117314 A | | 10/2020 |

\* cited by examiner

VIBRATION DEVICE AND APPARATUS INCLUDING THE SAME

CROSS-REFERENCE TO RELATED APPLICATIONS

This application is a Continuation application of U.S. patent application Ser. No. 17/555,091, filed on Dec. 17, 2021, which claims priority to Korean Patent Application No. 10-2020-0189825 filed in the Republic of Korea on Dec. 31, 2020, the entire contents of all these applications being incorporated by reference into the present application.

BACKGROUND

Technical Field

The present disclosure relates to a vibration device and an apparatus including the vibration device, and more particularly, to a vibration device having improved vibration characteristics and an apparatus including the vibration device.

Discussion of the Related Art

A display apparatus displays an image on a display panel, and a separate speaker should be installed to provide sound. When the speaker is disposed inside the display apparatus, the speaker occupies a space, so there can be a problem in that the design and the space arrangement of the display apparatus can be restricted.

Since sound output from the speaker moves backwards or downwards from the display apparatus, sound quality can be deteriorated due to the interference between sounds reflected from a wall or the ground. Therefore, it can be difficult to accurately transmit sound and sense of immersion experience of a viewer or a user can be reduced.

SUMMARY OF THE DISCLOSURE

Therefore, the inventors of the present disclosure recognized the problems mentioned above and other limitations associated with the related art, and conducted various experiments to implement a vibration device in which sound quality may be improved and sound pressure level characteristics may be improved. Through various experiments, an apparatus having a new structure including a vibration device capable of improving sound quality and sound pressure level characteristics was invented.

Accordingly, the present disclosure is to provide a vibration device and an apparatus including the same that substantially obviate one or more problems due to limitations and disadvantages of the related art.

An aspect of the present disclosure is to provide a vibration device capable of generating sound by vibrating a display panel and having improved sound pressure level characteristics, and an apparatus including the vibration device.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a vibration device including a vibration portion, a first electrode portion disposed at a first surface of the vibration portion, a second electrode portion disposed on a second surface of the vibration portion, in which the first electrode portion and the second electrode portion include at least one of a conductive metal particle and a carbon particle.

In another aspect, a vibration device includes a first electrode portion, a first vibration portion disposed at a rear surface of the first electrode portion, a third electrode portion disposed at a rear surface of the first vibration portion, a second vibration portion disposed at a rear surface of the third electrode portion, and a second electrode portion disposed at a rear surface of the second vibration portion, in which the first vibration portion and the second vibration portion have mutually opposite poling directions.

In another aspect, an apparatus includes a vibration object and a vibration generating device disposed at one surface of the vibration object, in which the vibration generating device includes a vibration portion, a first electrode portion disposed at a first surface of the vibration portion, a second electrode portion disposed on a second surface of the vibration portion, in which the first electrode portion and the second electrode portion include at least one of a conductive metal particle and a carbon particle.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate embodiments of the disclosure and together with the description serve to explain principles of the disclosure.

DETAILED DESCRIPTION OF THE EMBODIMENTS

Figure 1:
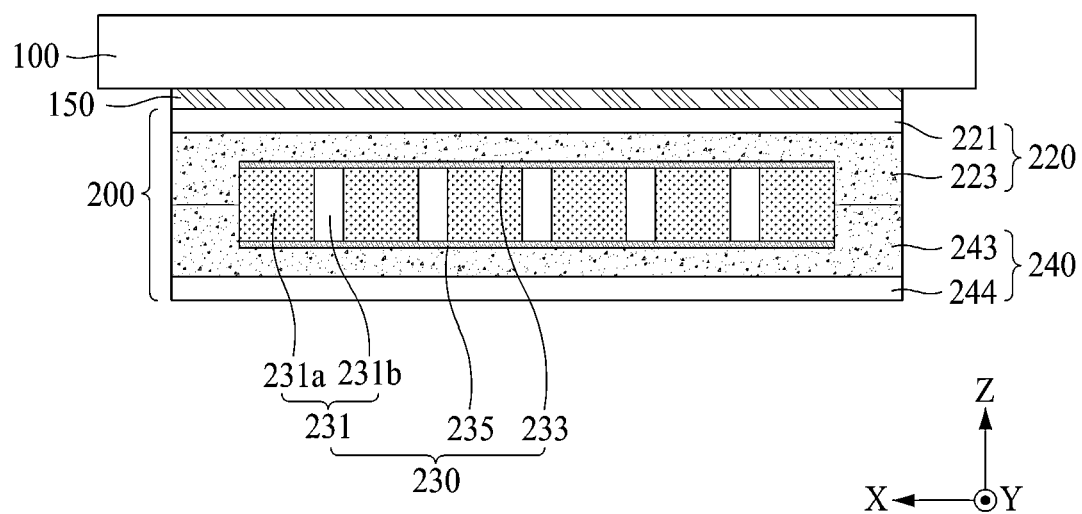
FIG. 1 illustrates a vibration device according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted or may be briefly provided. The progression of processing steps and/or operations described is an example, however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the disclosure. In the following description, when the detailed description of the relevant known function or configuration is determined to unnecessarily obscure the important point of the present disclosure, the detailed description will be omitted or may be briefly provided. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "above," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a situation that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In an embodiment of the present disclosure, examples of a display apparatus can include a narrow-sense display apparatus, such as an organic light emitting display (OLED) module or a liquid crystal module (LCM) including a display panel and a driver for driving the display panel. Also, examples of the display apparatus can include a set device (or a set apparatus) or a set electronic device, such as a notebook computer, a TV, a computer monitor, an equipment apparatus including an automotive apparatus or another type apparatus for vehicles, or a mobile electronic device, such as a smartphone or an electronic pad, which is a complete product (or a final product) including an LCM or an OLED module.

Therefore, in some embodiments of the present disclosure, examples of the display apparatus can include a narrow-sense display apparatus itself, such as an LCM or an OLED module, and a set device which is a final consumer device or an application product including the LCM or the OLED module.

In some embodiments of the present disclosure, an LCM or an OLED module including a display panel and a driver can be referred to as a narrow-sense display apparatus, and an electronic device which is a final product including an LCM or an OLED module can be referred to as a set device (or a set apparatus). For example, the narrow-sense display apparatus can include a display panel, such as an LCD or an OLED, and a source printed circuit board (PCB) which is a controller for driving the display panel. The set device can further include a set PCB which is a set controller electrically connected to the source PCB to overall control the set device.

A display panel applied to some embodiments of the present disclosure can use all types of display panels, such as a liquid crystal display panel, an organic light emitting diode (OLED) display panel, and an electroluminescent display panel, but is not limited to a specific display panel which is vibrated by a sound generation device according to an embodiment of the present disclosure to output a sound. Also, a shape or a size of a display panel applied to a display apparatus according to an embodiment of the present disclosure is not limited.

For example, if the display panel is the liquid crystal display panel, the display panel can include a plurality of gate lines, a plurality of data lines, and a plurality of pixels respectively provided in a plurality of pixel areas defined by intersections of the gate lines and the data lines. Also, the display panel can include an array substrate including a thin film transistor (TFT) which is a switching element for adjusting a light transmittance of each of the plurality of pixels, an upper substrate including a color filter and/or a black matrix, and a liquid crystal layer between the array substrate and the upper substrate.

Moreover, if the display panel is the organic light emitting display panel, the display panel can include a plurality of gate lines, a plurality of data lines, and a plurality of pixels respectively provided in a plurality of pixel areas defined by intersections of the gate lines and the data lines. Also, the display panel can include an array substrate including a thin film transistor (TFT) which is an element for selectively applying a voltage to each of the pixels, an organic light emitting device layer on the array substrate, and an encapsulation substrate disposed on the array substrate to cover the organic light emitting device layer. The encapsulation substrate can protect the thin film transistor (TFT) and the organic light emitting device layer from an external impact and can prevent water or oxygen from penetrating into the organic light emitting device layer. Also, a layer disposed on the array substrate can include an inorganic light emitting layer (for example, a nano-sized material layer, a quantum dot, or the like). As another example, the layer disposed on the array substrate can include a micro light emitting diode.

The display panel can further include a backing, such as a metal plate attached on the display panel. However, embodiments of the present disclosure are not limited to the metal plate, and the display panel can include another structure.

In an embodiment of the present disclosure, the display panel can be applied to vehicles as a user interface module, such as a central control panel for automobiles. For example, the display panel can be disposed between occupants sitting on two front seats in order for a vibration of the display panel to be transferred to the inside of a vehicle. Therefore, an audio experience in a vehicle is improved in comparison with a situation where speakers are disposed on interior sides of the vehicle.

Hereinafter, embodiments of the present disclosure will be described in detail with reference to the accompanying drawings. In adding reference numerals to elements of each of the drawings, although the same elements are illustrated in other drawings, like reference numerals can refer to like elements. Also, for convenience of description, a scale of each of elements illustrated in the accompanying drawings differs from a real scale, and thus, is not limited to a scale illustrated in the drawings.

Figure 2A:
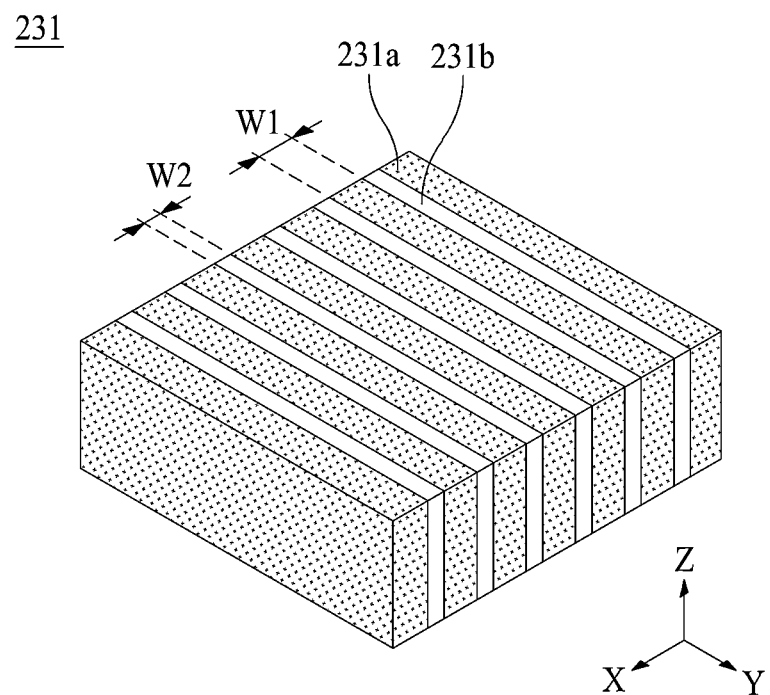
FIG. 2A is a perspective view of a vibration portion of the vibration device of FIG. 1.

FIG. 1 illustrates a vibration device according to an embodiment of the present disclosure. FIG. 2A is a perspective view of a vibration portion of the vibration device of FIG. 1. All the components of each vibration device according to all embodiments of the present disclosure are operatively coupled and configured.

With reference to FIGS. 1 and 2A, a vibration device according to an embodiment of the present disclosure includes a vibration generator 230, and the vibration generator 230 can include a vibration portion 231, a first electrode portion 233 disposed at a first surface of the vibration portion 231, and a second electrode portion 235 disposed at a second surface opposite to the first surface of the vibration portion 231. In addition, the vibration device can be disposed at one surface of a vibration object 100 and can transmit vibration to the vibration object 100 via the connection member 150.

According to an embodiment of the present disclosure, the vibration object 100 can be one or more of a display panel having pixels configured to display an image, a screen panel on which an image is projected from the display apparatus, a lighting panel, a vibrating plate, wood, plastic, glass, cloth, an interior material of a vehicle, a glass window of a vehicle, an interior ceiling of a building, a glass window of a building, an interior material of an aircraft, and a glass window of an aircraft.

The vibration portion 231 can include a piezoelectric material having a piezoelectric effect, a composite piezoelectric material, or an electroactive material. The vibration portion 231 can include an inorganic material and an organic material. For example, the vibration portion 231 can include a plurality of inorganic material portions formed of a piezoelectric material and at least one organic material portion formed of a soft material. For example, the vibration portion 231 can be expressed as a piezoelectric vibration portion, a piezoelectric composite layer, a piezoelectric composite, or a piezoelectric ceramic composite, but embodiments of the present disclosure are not limited thereto. Since the vibration portion 231 can be formed of a transparent, semi-transparent, or opaque piezoelectric material, the vibration portion 231 can be transparent, semi-transparent, or opaque. The vibration portion 231 or the vibration generator 230 can be expressed as a flexible vibration generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, etc., but embodiments of the present disclosure are not limited thereto.

The vibration portion 231 according to an embodiment of the present disclosure can include a plurality of first portions 231a and a plurality of second portions 231b. For example, the plurality of first portions 231a and the plurality of second portions 231b can be alternately and repeatedly disposed along a first direction X (or a second direction Y). For example, the first direction X can be a horizontal direction of the vibration portion 231, and the second direction Y can be a vertical direction of the vibration portion 231 intersecting the first direction X, but embodiments of the present disclosure are not limited thereto. For example, the first direction X can be a vertical direction of the vibration portion 231, and the second direction Y can be a horizontal direction of the vibration portion 231.

Each of the plurality of first portions 231a can be formed of an inorganic material portion. The inorganic material portion can include the material mentioned above. For example, the first portion 231a can be formed of a ceramic-based material capable of realizing a relatively high vibration or a piezoelectric ceramic having a perovskite-based crystal structure. The perovskite crystal structure has a piezoelectric and reverse piezoelectric effect and can be a plate-shaped structure having orientation. The perovskite crystal structure is represented by a chemical formula of $ABO_3$, an A site can be formed of a divalent metal element, and a B site can be formed of a tetravalent metal element. As an embodiment of the present disclosure, in the formula of $ABO_3$, the A site and the B site can be a cation, and O can be an anion. For example, it can include at least one of $PbTiO_3$, $PbZrO_3$, $PbZrTiO_3$, $BaTiO_3$, and $SrTiO_3$, but embodiments of the present disclosure are not limited thereto.

The first portion 231a according to an embodiment of the present disclosure can include at least one of lead (Pb), zirconium (Zr), titanium (Ti), zinc (Zn), nickel (Ni), and niobium (Nb), but embodiments of the present disclosure are not limited thereto.

In another embodiment of the present disclosure, the first portion 231a can include a lead zirconate titanate (PZT)-based material including lead (Pb), zirconium (Zr), and titanium (Ti), or a lead zirconate nickel niobate (PZNN)-based material including lead (Pb), zinc (Zn), nickel (Ni), and niobium (Nb), but is not limited thereto. Alternatively, the first portion 231a can include at least one of $CaTiO_3$, $BaTiO_3$, and $SrTiO_3$ without lead (Pb), but embodiments of the present disclosure are not limited thereto.

In another embodiment of the present disclosure, the first portion 231a can have a piezoelectric strain coefficient $d_{33}$ of 1,000 pC/N or more in a thickness direction Z. Having a high piezoelectric strain coefficient $d_{33}$, the vibration device can be applied to a large-sized display panel or can have sufficient vibration characteristics or piezoelectric characteristics. For example, the first portion 231a can have a PZT-based material ($PbZrTiO_3$) as a main component and can include a softener dopant material doped to the A site (Pb), and a relaxer ferroelectric material doped to the B site (ZrTi).

The softener dopant material can improve piezoelectric and dielectric properties of the first portion 231a, for example, can increase the piezoelectric strain coefficient $d_{33}$ of the first portion 231a. When the softener dopant material includes a +1 valent element, piezoelectric properties and dielectric properties can be reduced. For example, when the softener dopant material includes potassium (K) and rubidium (Rb), the piezoelectric properties and dielectric properties can be reduced. Accordingly, it was recognized through various experiments that the softener dopant material should include +2-valent to +3-valent elements in order to improve the piezoelectric properties and dielectric properties. The softener dopant material according to an embodiment of the present disclosure can include a +2-valent to +3-valent element. Since a morphotropic phase boundary (MPB) can be configured by including a softener dopant material in the PZT-based material ($PbZrTiO_3$), piezoelectric properties and dielectric properties can be improved. For example, the softener dopant material can be strontium (Sr), barium (Ba), lanthanum (La), neodymium (Nd), calcium (Ca), yttrium (Y), erbium (Er), or ytterbium (Yb). For example, ions ($Sr^{2+}$, $Ba^{2+}$, $La^{2+}$, $Nb^5$, $Ca^+Y^{3+}$, $Er^{3+}$, and $Yb^{3+}$) of the softener dopant material doped in the PZT-based material ($PbZrTiO_3$) substitutes a part of lead (Pb) in the PZT-based material ($PbZrTiO_3$), and the substitution amount can be 0.01 to 0.2 mol %. For example, if the substitution amount is less than 2 mol % or exceeds 20 mol %, the perovskite crystal structure is broken, so that the electromechanical coupling coefficient (kp) and the piezoelectric strain coefficient $d_{33}$ can decrease. When the softener dopant material is substituted, a morphotropic phase boundary region can be formed and high piezoelectric properties and dielectric properties can be obtained in the phase transition boundary region, so that a vibration device having high piezoelectric properties and dielectric properties can be realized.

According to an embodiment of the present disclosure, the relaxer ferroelectric material doped in the PZT-based material ($PbZrTiO_3$) can improve electric deformation characteristics of the first portion 231a. The relaxer ferroelectric material according to an embodiment of the present disclosure can include a lead magnesium niobate (PMN)-based material or a lead nickel niobate (PNN)-based material, but embodiments of the present disclosure are not limited thereto. The PMN-based material can include lead (Pb), magnesium (Mg), and niobium (Nb) and can be, for example, $Pb(Mg, Nb)O_3$. The PNN-based material can include lead (Pb), nickel (Ni), and niobium (Nb) and can be, for example, $Pb(Ni, Nb)O_3$. For example, a relaxer ferroelectric material doped in a PZT-based material ($PbZrTiO_3$) substitutes a part of each of zirconium (Zr) and titanium (Ti) in the PZT-based material ($PbZrTiO_3$), and the substitution amount can be 5 to 25 mol %. For example, if the substitution amount is less than 5 mol % or exceeds 25 mol %, the perovskite crystal structure is broken, so that the electromechanical coupling coefficient (kp) and the piezoelectric strain coefficient $d_{33}$ can decrease.

According to an embodiment of the present disclosure, the first portion 231a can further include a donor material doped in the B site (ZrTi) of the PZT-based material (PbZr- $TiO_3$) to further improve the piezoelectric coefficient. For example, the donor material doped in the B site (ZrTi) can include +4-valent to +6-valent elements. For example, the donor material doped in the B site (ZrTi) can include tellurium (Te), germanium (Ge), uranium (U), bismuth (Bi), niobium (Nb), tantalum (Ta), and antimony (Sb), or tungsten (W).

Since the first portion 231a according to an embodiment of the present disclosure can have a piezoelectric strain coefficient $d_{33}$ of 1,000 pC/N or more in the thickness direction Z, a vibration device having improved vibration characteristics can be implemented. For example, a vibration device having improved vibration characteristics can be implemented in a device having a large area.

Each of the plurality of first portions 231a according to an implementation of the present disclosure can be disposed between the plurality of second portions 231b. The plurality of second portions 231b can be disposed (or arranged) in parallel with each other with the plurality of first portions 231a interposed therebetween. Each of the plurality of first portions 231a can have a first width W1 parallel to a first direction X (or a second direction Y) and can have a length parallel to the second direction Y (or the first direction X). Each of the plurality of second portions 231b can have a second width W2 parallel to the first direction X (or the second direction Y) or can have a length parallel to the second direction Y (or the first direction X). The first width W1 can be the same as or different from the second width W2. Each of the plurality of second portions 231b can have the same size, for example, the same width, the same area, or the same volume. For example, each of the plurality of second portions 231b can have the same size, for example, the same width, the same area, or the same volume, within a process error (or tolerance) range generated in a manufacturing process. For example, the first width W1 can be greater than the second width W2. For example, the first portion 231a and the second portion 231b can include a line shape or a stripe shape having the same or different sizes. Accordingly, the vibration portion 231 can have a 2-2 composite including the first portion 231a and the second portion 231b to have a resonant frequency of 20 kHz or less, but embodiments of the present disclosure are not limited thereto. For example, the resonant frequency of the vibration portion 231 can be changed according to at least one or more of a shape, length, and thickness.

In the vibration portion 231, each of the plurality of first portions 231a and the plurality of second portions 231b can be disposed (or arranged) in parallel with each other on the same plane (or on the same layer). Each of the plurality of second portions 231b can be configured to fill a gap between two adjacent first portions 231a. Each of the plurality of second portions 231b can be connected to or adhered to an adjacent first portion 231a. Each of the plurality of second portions 231b can be configured to fill a gap between the two adjacent first portions 231a, and thus can be connected to or adhered to the adjacent first portions 231a. Accordingly, the vibration portion 231 can be expanded to a desired size or length by side coupling (or connection) of the first portion 231a and the second portion 231b. Also, the vibration portion 231 can have a modular design that can be easily increased or decreased in size, as desired (e.g., to correspond to certain sized displays or panels, and provide desired frequency ranges).

In the vibration portion 231, the width W2 of each of the plurality of second portions 231b can gradually decrease from a middle portion of the vibration portion 231 toward both edge portions (or both ends).

According to an embodiment of the present disclosure, the second portion 231b having the largest width W2 among the plurality of second portions 231b can be disposed in a portion on which the largest stress is concentrated when the vibration portion 231 vibrates in a vertical direction Z (or thickness direction). The second portion 231b having the smallest width W2 among the plurality of second portions 231b can be disposed in a portion in which the smallest stress occurs when the vibration portion 231 vibrates in the vertical direction Z. For example, the second portion 231b having the largest width W2 among the plurality of second portions 231b can be disposed in the middle portion of the vibration portion 231, and the second portion 231b having the smallest width W2, among the plurality of second portions 231b, can be disposed at at least one of both edge portions (or periphery portions) of the vibration portion 231. Accordingly, when the vibration portion 231 vibrates in the vertical direction Z, interference of sound waves or overlapping of resonant frequencies occurring in a portion where the greatest stress is concentrated can be minimized. Accordingly, a dip phenomenon occurring in a low register range can be improved and flatness of the acoustic characteristics in the low register range can be improved. For example, the flatness of the acoustic characteristic can be a magnitude of deviation between the highest sound pressure level and the lowest sound pressure level.

In the vibration portion 231, each of the plurality of first portions 231a can have a different size (or width). For example, the size (or width) of each of the plurality of first portions 231a can gradually decrease or increase from the middle portion of the vibration portion 231 toward both edge portions (or both ends). In the vibration portion 231, sound pressure level characteristics of sound can be improved by various natural vibration frequencies according to vibration of each of the plurality of first portions 231a having different sizes, and a sound reproduction band can be extended.

Each of the plurality of second portions 231b can be disposed between the plurality of first portions 231a. Accordingly, in the vibration portion 231, vibration energy due to a link in a unit lattice of the first portion 231a can be increased by the second portion 231b, so that vibration characteristics can be increased and the piezoelectric characteristics and flexibility can be secured.

For example, the second portion 231b can be at least one of an epoxy-based polymer, an acryl-based poly, and a silicone-based polymer, but embodiments of the present disclosure are not limited thereto.

The second portion 231b according to an embodiment of the present disclosure can be formed of an organic material portion. For example, the organic material portion can be disposed between the inorganic material portions to absorb an impact applied to the inorganic material portion (or the first portion), release stress concentrated on the inorganic material portion to improve durability of the vibration portion 231, and provide flexibility to the vibration portion 231.

The second portion 231b according to an embodiment of the present disclosure can have a lower modulus and viscoelasticity as compared to the first portion 231a. Accordingly, the reliability of the first portion 231a, which is vulnerable to impact due to brittle characteristics of the first portion 231a, can be improved.

For example, the vibration device for vibrating the vibration object 100 can have maximum vibration characteristics when the vibration device has impact resistance and high rigidity. In order for the vibration device to have impact resistance and high rigidity, each of the plurality of second portions 231b can be formed of a material having relatively high damping factor (tan δ) and relatively high stiffness characteristics. For example, each of the plurality of second portions 231b can be formed of a material having a damping vector tan δ of 0.1 to 1 Gpa and stiffness characteristics of 0 to 10 Gpa. In addition, the damping vector (tan δ) and the stiffness characteristics can be explained by a correlation between a loss coefficient and the modulus. For example, the second portion 231b can be formed of a material having a loss coefficient of 0.01 to 1 and a modulus of 1 to 10 Gpa.

An organic material portion included in the second portion 231b can include an organic material, an organic polymer, an organic piezoelectric material, or an organic non-piezoelectric material having flexible properties compared to the inorganic material portion which is the first portion 231a. For example, the second portion 231b can be expressed as an adhesive portion having flexibility, a stretchable portion, a bending portion, a damping portion, or a flexible portion, but embodiments of the present disclosure are not limited thereto.

Since the organic material portion including the organic piezoelectric material can absorb impact applied to the inorganic material portion (or the first portion), overall durability of the vibration device can be improved and piezoelectric properties of a certain level can be provided. The organic piezoelectric material according to an embodiment of the present disclosure can be an organic material having an electroactive property. For example, it can include at least one of polyvinylidene fluoride (PVDF), β-polyvinylidene fluoride (β-PVDF), and polyvinylidene-trifluoroethylene (PVDF-TrFE), but embodiments of the present disclosure are not limited thereto.

Since the organic material portion including the organic non-piezoelectric material can include a curable resin composition and an adhesive including the same to absorb impact applied to the inorganic material portion (or the first portion), so that durability of the entire vibration device can be improved. The organic non-piezoelectric material according to an embodiment of the present disclosure can include at least one of an epoxy-based polymer, an acrylic-based polymer, and a silicone-based polymer, but embodiments of the present disclosure are not limited thereto.

For example, the organic material portion including the organic non-piezoelectric material can include an epoxy resin for high rigidity properties required for the vibration device and an adhesion promoter for adhesion with the inorganic material portion. For example, the adhesion promoter can be a phosphate-based agent, but embodiments of the present disclosure are not limited thereto. The organic material portion can be cured by at least one of thermal curing and photocuring. In order to prevent thickness uniformity of the vibration device from being reduced due to shrinkage of the organic material portion due to volatilization of the solvent during curing of the organic material portion, a solvent-free type epoxy resin can be used, but embodiments of the present disclosure are not limited thereto.

The organic material portion including the organic non-piezoelectric material can further include a reinforcing agent for damping characteristics in addition to the high rigidity of the vibration device. For example, the reinforcing agent can be methylmethacrylate-butadiene-styrene (MBS) of a core shell type, and the content thereof can be 5 to 40 wt %. In the situation of the reinforcing agent, as a core-shell type elastic body, a shell portion can have high bonding strength with an epoxy resin such as an acrylic polymer, thereby improving impact resistance or damping characteristics of the vibration device.

The vibration portion 231 according to an embodiment of the present disclosure can have a single thin film shape by disposing (or connecting) the plurality of first portions 231a and second portions 231b on the same plane. For example, the plurality of first portions 231a of the vibration portion 231 can have a structure connected to one side. For example, the plurality of first portions 231a can have a structure connected to the whole of the vibration portion 231. For example, the vibration portion 231 can vibrate in the vertical direction by the first portion 231a having vibration characteristics, and can be bent in a curved shape by the second portion 231b having the flexibility. In addition, in the vibration portion 231 according to an embodiment of the present disclosure, the size of the first portion 231a and the size of the second portion 231b can be adjusted according to the piezoelectric properties and flexibility required for the vibration portion 231. As an embodiment of the present disclosure, in the situation of the vibration portion 231 requiring piezoelectric properties rather than flexibility, the size of the first portion 231a can be larger than the size of the second portion 231b. In another embodiment of the present disclosure, in the situation of the vibration portion 231 requiring flexibility rather than piezoelectric properties, the size of the second portion 231b can be larger than the size of the first portion 231a. Accordingly, since the size of the vibration portion 231 can be adjusted according to required characteristics, there is an advantage in that the vibration portion 231 may be easily designed and adjusted.

The first electrode portion 233 can be disposed at the first surface (or front surface) of the vibration portion 231. The first electrode portion 233 can be commonly disposed or coupled to the first surface of each of the plurality of first portions 231a and the first surface of each of the plurality of second portion 231b. The first electrode portion 233 can be electrically connected to each of the first surfaces of the plurality of first portions 231a. For example, the first electrode portion 233 can be disposed at the entire first surface of the vibration portion 231. The first electrode portion 233 can have a cylindrical electrode shape. For example, the first electrode portion 233 can have substantially the same shape as the vibration portion 231, but embodiments of the present disclosure are not limited thereto. The first electrode portion 233 according to an embodiment of the present disclosure can be formed of a transparent conductive material, a semi-transparent conductive material, or an opaque conductive material, but embodiments of the present disclosure are not limited thereto.

The second electrode portion 235 can be disposed at a second surface (or upper surface) opposite to or different from the first surface of the vibration portion 231. The second electrode portion 235 can be commonly disposed on or coupled to the second surface of each of the plurality of first portions 231a and the second surface of each of the plurality of organic portions 231b. The second electrode portion 235 can be electrically connected to the second surface of each of the plurality of first portions 231a. For example, the second electrode portion 235 can be disposed at the entire second surface of the vibration portion 231. The second electrode portion 235 can have a cylindrical electrode shape. For example, the second electrode portion 235 can have the same shape as the vibration portion 231, but embodiments of the present disclosure are not limited thereto. The second electrode portion 235 according to an embodiment of the present disclosure can be formed of a transparent conductive material, a semi-transparent conductive material, or an opaque conductive material, but embodiments of the present disclosure are not limited thereto.

Each of the vibration portions 231 of the vibration generator 230 can be polled by a certain voltage applied to the first electrode portion 233 and the second electrode portion 235 in a constant temperature atmosphere or a temperature atmosphere changing from high temperature to room temperature, but embodiments of the present disclosure are not limited thereto. For example, the vibration portion 231 of each of the vibration generators 230 can vibrate by alternately and repeatedly contracting and expanding due to an inverse piezoelectric effect according to a vibration driving signal applied to the first electrode portion 233 and the second electrode portion 235 from the outside. For example, the vibration portion 231 of the vibration generator 230 vibrates by vibration in a vertical direction and in a plane direction (or in a horizontal direction) by the first electrode portion 233 and the second electrode portion 235. Displacement of the vibration device or displacement of the display panel can be increased by the contraction and expansion of the vibration portion 231 in the planar direction, thereby further improving the vibration of the vibration device or the display panel.

The connection member 150 can be disposed between the vibration device and the vibration object 100 to connect or couple the vibration device to a rear surface of the vibration object 100. For example, the vibration device can be directly connected or coupled to the rear surface of the vibration object 100 via the connection member 150 to be supported or disposed at the rear surface of the vibration object 100.

The connection member 150 according to an embodiment of the present disclosure can be formed of a material including an adhesive layer having excellent adhesion or bonding strength to the rear surface of the display panel 1100 and the vibration device, respectively. For example, the connection member 150 can include a foam pad, a double-sided tape, or an adhesive, but embodiments of the present disclosure are not limited thereto. For example, the adhesive layer of the connection member 150 can include, but embodiments of the present disclosure are not limited to, epoxy, acryl, silicone, or urethane. For example, the adhesive layer of the connection member 150 can be from the same as or different from the adhesive layer of the adhesive member 1150. For example, the adhesive layer of the connection member 150 can include an acryl-based material having relatively excellent adhesion and high hardness among acrylic and urethane. Accordingly, the vibration of the vibration device can be well transferred to the display panel 1100.

The connection member 150 according to another embodiment of the present disclosure can further include a hollow portion provided between the vibration object 100 and the vibration device. The hollow portion of the connection member 150 can provide an air gap between the vibration object 100 and the vibration device. The air gap minimizes loss of vibration due to the connection member 150 by allowing a sound wave (or sound pressure level) according to the vibration of the vibration device to be concentrated on the vibration object 100 without being dispersed by the connection member 150, and thus, sound pressure level characteristics of the sound generated according to the vibration of the vibration object 100 can be increased. For example, the hollow portion of the connection member 150 can help form a type of resonance chamber behind the display panel.

The vibration device according to an embodiment of the present disclosure can further include a first protective member 220 and a second protective member 240 on the first (or front) and second (or rear) surfaces of the vibration generator 230.

The first protective member 220 can be disposed at the first electrode portion 233. The first protective member 220 can protect the first electrode portion 233. The second protective member 240 can be disposed at the second electrode portion 235, and the second protective member 240 can protect the second electrode portion 235. For example, each of the first protective member 220 and the second protective member 240 of the vibration generator 230 can be formed of a plastic material or a fiber material, but embodiments of the present disclosure are not limited thereto. For example, in the vibration generator 230, the first protective member 220 can be formed of the same material as or different from that of the second protective member 240. At least one of the first protective member 220 and the second protective member 240 of the vibration generator 230 can be connected to or coupled to the rear surface of the vibration object 100 via a connection member 210. For example, the first protective member 220 of the vibration generator 230 can be connected to or coupled to the rear surface of the vibration object 100 via the connection member 210.

The first protective member 220 can include a base member 221 and an adhesive layer 223, and the adhesive layer 223 can be formed to be adjacent to the vibration generator 230 rather than the base member 221. The adhesive layer 223 of the first protective member 220 can be disposed between the first electrode portion 233 of the vibration generator 230 and the base member 221 of the first protective member 220.

The second protective member 240 can include a base member 244 and an adhesive layer 243, and the adhesive layer 243 can be formed to be adjacent to the vibration generator 230 rather than the base member 244. The adhesive layer 243 of the second protective member 240 can be disposed between the second electrode portion 235 of the vibration generator 230 and the base member 244 of the first protective member 240.

Each of the base members 221 and 244 of the first and second protective members 220 and 240 can be formed of a polyimide film or a polyethylene terephthalate film, but embodiments of the present disclosure are not limited thereto.

Each of the adhesive layers 223 and 243 of the first and second protective members 220 and 240 can include an epoxy resin, an acryl resin, a silicone resin, or urethane resin, but embodiments of the present disclosure are not limited thereto.

The adhesive layer 223 of the first protective member 220 and the adhesive layer 243 of the second protective member 240 can be connected or coupled to each other between the first protective member 220 and the second protective member 240. For example, the adhesive layer 223 of the first protective member 220 and the adhesive layer 243 of the second protective member 240 can be connected or coupled to each other at an edge portion between the first protective member 220 and the second protective member 240. Accordingly, the first vibration portion 231 of the vibration generator 230 can be surrounded by the adhesive layer 223 of the first protective member 220 and the adhesive layer 243 of the second protective member 240. For example, the adhesive layer 223 of the first protective member 220 and the adhesive layer 243 of the second protective member 240 can completely surround the first vibration portion 231 of the vibration generator 230. For example, the adhesive layer 223 of the first protective member 220 and the adhesive layer 243 of the second protective member 240 can be expressed as a cover member, and the like, but embodiments of the present disclosure are not limited thereto. When the adhesive layer 223 of the first protective member 220 and the adhesive layer 243 of the second protective member 240 are cover members, the first protective member 220 can be disposed at the first surface of the cover member and the second protective member 240 can be disposed at the second surface of the cover member.

Figure 2B:
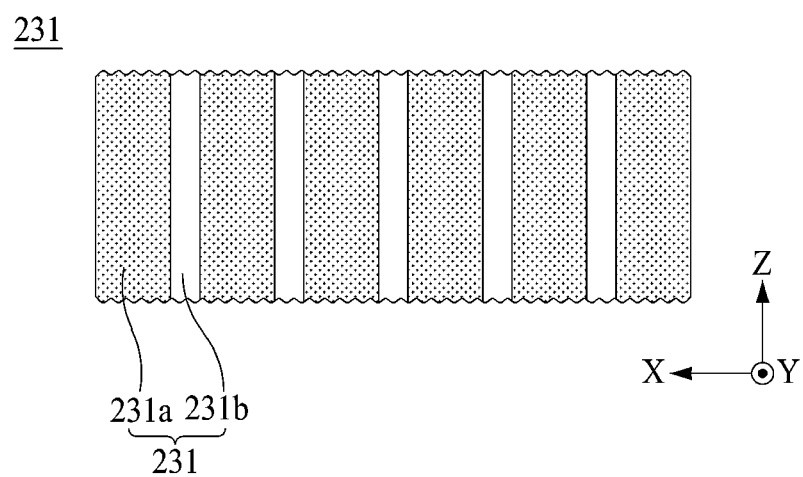
FIG. 2B is a cross-sectional view of the vibration portion of the vibration device of FIG. 1.
Figure 2C:
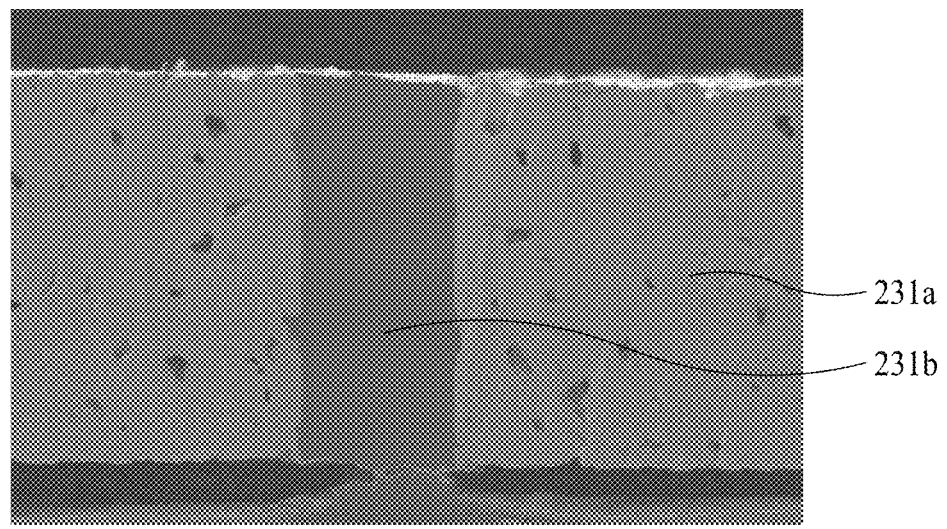
FIG. 2C is a scanning electron micrograph of the vibration portion of the vibration device of FIG. 1.

FIG. 2B is a cross-sectional view of a vibration portion of the vibration device of FIG. 1, and FIG. 2C is a scanning electron micrograph of the vibration portion of the vibration device of FIG. 1.

With reference to FIGS. 2A, 2B, and 2C, a first surface (or front surface) of the vibration portion 231 according to an embodiment of the present disclosure and a second surface (or rear surface) opposite the first surface can have predetermined surface roughness.

Here, the first surface (or front surface) of the vibration portion 231 or other configuration can be a surface facing the vibration object 100. The second surface (or rear surface) of the vibration portion 231 or another configuration can be a surface that does not face the vibration object 100.

Figure 3A:
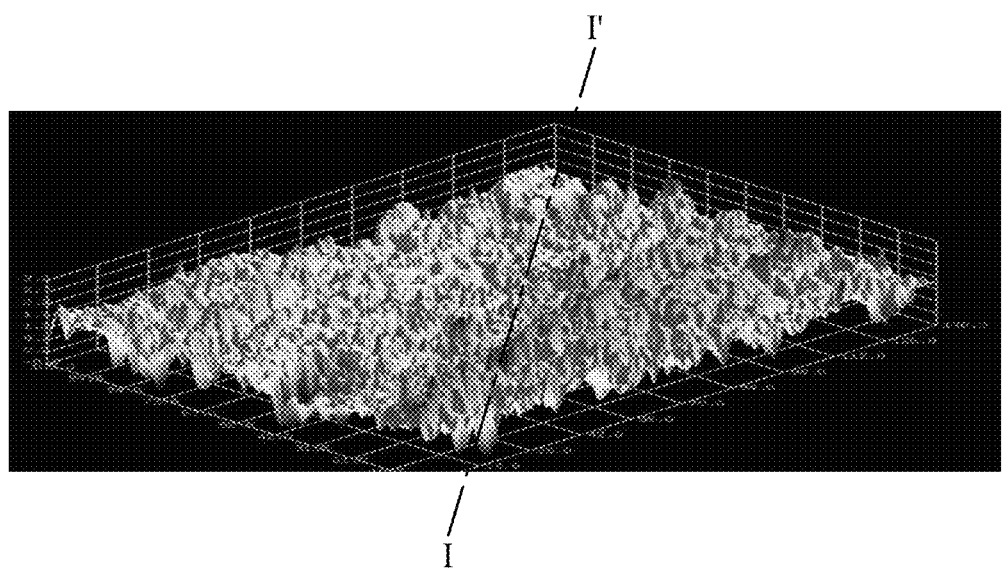
FIG. 3A is an atomic force micrograph of a surface of the vibration portion according to an embodiment of the present disclosure.
Figure 3B:
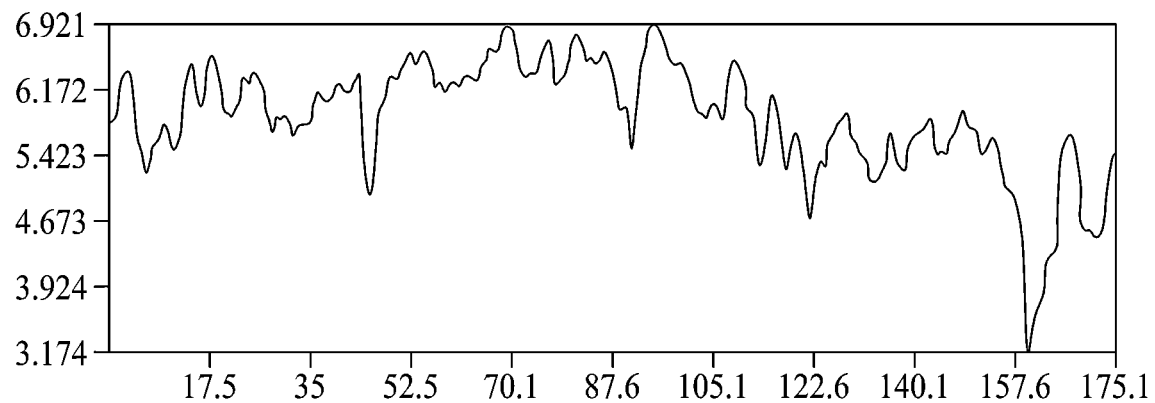
FIG. 3B is an illuminance value line-scanned along I-I' of FIG. 3A.

FIG. 3A is an atomic force micrograph of a surface of the vibration portion of the present disclosure, and FIG. 3B is an illuminance value line-scanned along I-I' of FIG. 3A. In FIG. 3B, the horizontal axis is length (μm), and the vertical axis is roughness (μm).

With reference to FIG. 3A, it can be seen that the surface (the first surface or the second surface) of the vibration portion 231 captured by an atomic force microscope (AFM) has a predetermined surface roughness over the entire predetermined area. In FIG. 3B, with reference to numerical values of surface roughness scanned over a length of about 180 μm, a minimum surface roughness value is 3.175 μm, and a maximum value is 6.921 μm. Therefore, it can be seen that a maximum roughness (Rmax) is 3.746 μm. In addition, an average roughness (Ra) of the surface of the vibration portion 231 was repeatedly measured several times, whereby the average roughness Ra of the surface of the vibration portion 231 was measured to be about 1.5 μm.

Figure 4A:
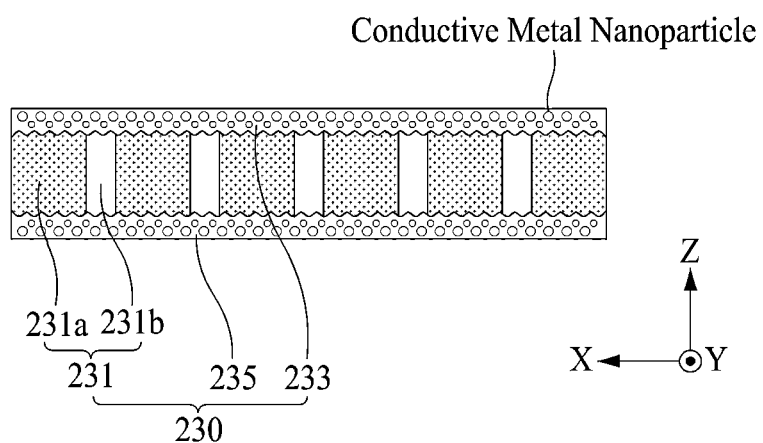
FIG. 4A is a cross-sectional view showing a structure of a vibration generator of the vibration device of FIG. 1.
Figure 4B:
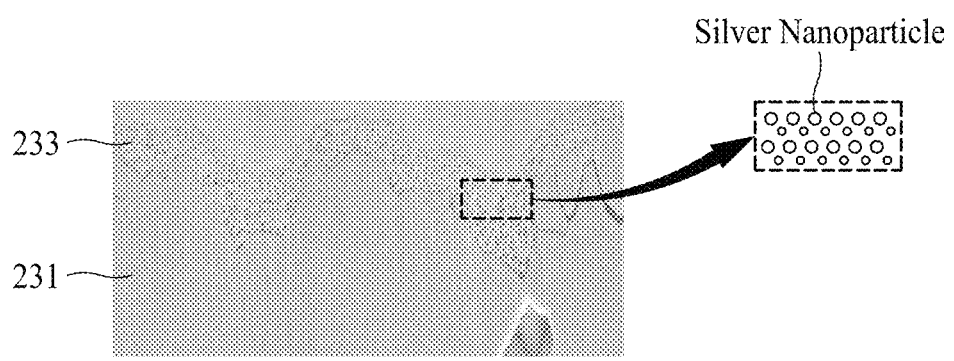
FIG. 4B is a photograph of a boundary between a vibration portion and an electrode portion of the vibration generator of FIG. 4A taken with a scanning electron microscope.

FIG. 4A is a cross-sectional view showing a structure of the vibration generator of the vibration device of FIG. 1, and FIG. 4B is a photograph of a boundary between a vibration portion and an electrode portion of the vibration generator of FIG. 4A taken with a scanning electron microscope.

With reference to FIG. 4A, a first electrode portion 233 (e.g., upper electrode portion) is disposed at a first surface of the vibration portion 231, and a second electrode portion 235 (e.g., lower electrode portion) is disposed at a second surface opposite to the first surface of the vibration portion 231. In this situation, the first electrode portion 233 and the second electrode portion 235 can include a conductive metal nanoparticle. For example, the conductive metal nanoparticle can have a particle size less than 1 μm. The conductive metal nanoparticle can be spherical particle, but in the present disclosure, the shape of the conductive metal nanoparticle included in the electrode portion may not be limited. For example, the conductive metal nanoparticle can be particle having an aspect ratio that does not exceed 2.

As described above in FIGS. 2B to 3B, in the vibration portion 231 according to an embodiment of the present disclosure, a first surface (or upper surface) and a second surface (or lower surface) opposite to the first surface can have a certain surface roughness and can have a surface roughness of several μm level. Therefore, if the size of the conductive metal nanoparticle included in the first electrode portion 233 or the second electrode portion 235 exceeds 1 μm, in the first surface (or upper surface) of the vibration portion 231, a void can occur, without filling the surface roughness formed on the second surface (or lower surface) opposite to the first surface. If the size of the conductive metal nanoparticle included in the first electrode portion 233 or the second electrode portion 235 exceeds 1 μm, interfacial characteristics between the vibration portion 231 and the first electrode portion 233 or the second electrode portion can be lowered, thus degrading the characteristics of the vibration device.

The metal material including the conductive metal nanoparticle can include at least one or more of silver (Ag), gold (Au), platinum (Pt), and copper (Cu), but embodiments of the present disclosure are not limited thereto. The first electrode portion 233 and the second electrode portion 235 include at least one or more of silver (Ag), gold (Au), platinum (Pt), and copper (Cu) having high electrical conductivity or low resistivity. Therefore, the conductivity of the first electrode portion 233 and the second electrode portion 235 can be improved and the sheet resistance Rs of the first electrode portion 233 and the second electrode portion 235 can be reduced. For example, the resistivity of the first electrode portion 233 or the second electrode portion 235 including a silver (Ag) nanoparticle can be about $10^{-5}$ Ω·cm.

The first electrode portion 233 and the second electrode portion 235 can be formed or coated on the vibration portion 231 using a composition including a conductive metal nanoparticle, a binder, a solvent, and a resin, and then sintered. With respect to the electrode composition for forming the first electrode portion 233 and the second electrode portion 235, the conductive metal nanoparticle can be included in an amount of 60 to 70 wt %, or 65 wt %. In addition, in the process of sintering the first electrode portion 233 and the second electrode portion 235, at least a portion of the solvent can be volatilized.

According to this specification, the first electrode portion 233 or the second electrode portion 235 can be formed on the vibration portion 231 by printing or coating. Therefore, the first electrode portion 233 or the second electrode portion 235 can be prepared by preparing an electrode portion composition including conductive metal nanoparticle, a binder, and a solvent, and applying the prepared composition on the vibration portion 231. The binder can include at least one of a urethane-based, acrylic-based, or epoxy-based thermosetting resin, and the solvent can include a polar solvent or a non-polar solvent.

In addition, when the conductive metal nanoparticle is a silver (Ag) nanoparticle, the electrode portion composition can further include a fatty acid silver salt.

The electrode composition can be applied to the first surface (or upper surface) of the vibration portion 231 or the second surface (or lower surface) opposite to the first surface, and then sintered in a range of a preset sintering temperature. Here, the temperature for sintering the electrode portion composition can be 150° C. or lower.

As described above, the vibration portion 231 can include an organic vibration portion 231b, and if the process of preparing the first electrode portion 233 and the second electrode portion 235 exceeds 150° C., the organic vibration portion 231b can deteriorate at a temperature exceeding 150° C., and thus reliability can be reduced and the flexible characteristics of the organic vibration portion 231b can be deteriorated. Accordingly, vibration characteristics of the vibration generator 230 can be deteriorated.

Therefore, by preparing the first electrode portion 233 and the second electrode portion 235 of the vibration generator according to an embodiment of the present disclosure at a process temperature of 150° C. or lower, degradation of the organic vibration portion 231b can be prevented, having an advantages of flexible characteristics of the vibration generator 230 and deterioration of the vibration characteristics due to degradation of the organic vibration portion 231b can be prevented.

With reference to FIG. 4B, it can be seen that the vibration portion 231 and the first electrode portion 233 having a predetermined surface roughness have an interface in a very close contact state, and it can be seen that no voids are observed at the interface of the first electrode portion 233 and the vibration portion 231. The first electrode portion 233 of FIG. 4B can be prepared by applying a composition including a silver (Ag) nanoparticle on the first surface of the vibration portion 231 and then sintering at a temperature of 150° C.

According to an embodiment of the present disclosure, it can be seen that, since the first electrode portion 233 and the second electrode portion 235 include a conductive metal nanoparticle having a particle size of 1 µm or less, the vibration portion 231 and the first electrode portion 233 and the second electrode portion 235 can have an interfacial contact state without void formation, and a specific surface area of the first electrode portion 233 and the second electrode portion 235 can be improved. For example, the small sized conductive metal nanoparticles can effectively fill the peaks and valleys within the surface roughness without producing undesirable voids.

Therefore, the vibration generator 230 according to an embodiment of the present disclosure can provide a structure in which the interface between the vibration portion 231 and the electrode portion (the first electrode portion 233 or the second electrode portion 235) is in close contact. In addition, the first electrode portion 233 and the second electrode portion 235 prepared according to an embodiment of the present disclosure can have low contact resistance (Rc) characteristics.

According to an embodiment of the present disclosure, the thickness of the first electrode portion 233 and the second electrode portion 235 can have a range of 1 to 10 µm, or 3 to 7 µm, or be adjusted to a thickness of 5 µm. Also, the thicknesses of the first electrode portion 233 and the second electrode portion 235 can be greater than the surface roughness value of the vibration portion 231. For example, the thicknesses of the first electrode portion 233 and the second electrode portion 235 can be less than 5 µm. In this disclosure, the thicknesses of the first electrode portion 233 and the second electrode portion 235 are not limited thereto.

The thicknesses of the first electrode portion 233 and the second electrode portion 235 can be adjusted or set at an appropriate level to satisfy the preset electrical characteristics of the first electrode portion 233 and the second electrode portion 235.

Figure 5:
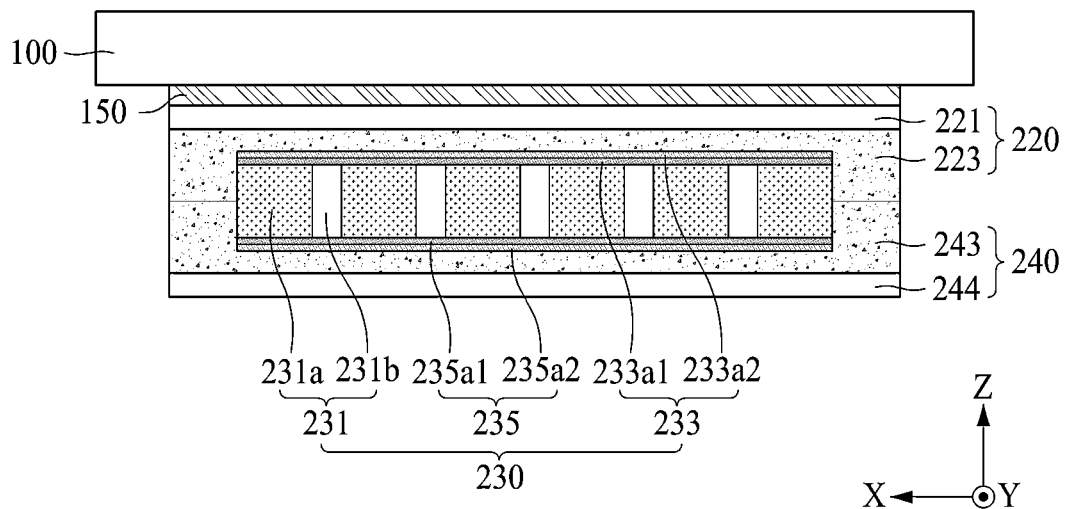
FIG. 5 illustrates a vibration device according to another embodiment of the present disclosure.
Figure 6A:
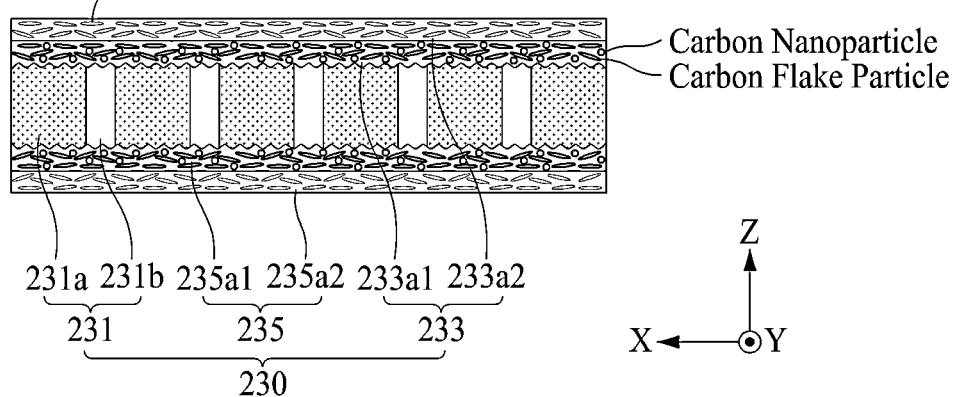
FIG. 6A is a cross-sectional view illustrating a structure of a vibration generator of the vibration device of FIG. 5.
Figure 6B:
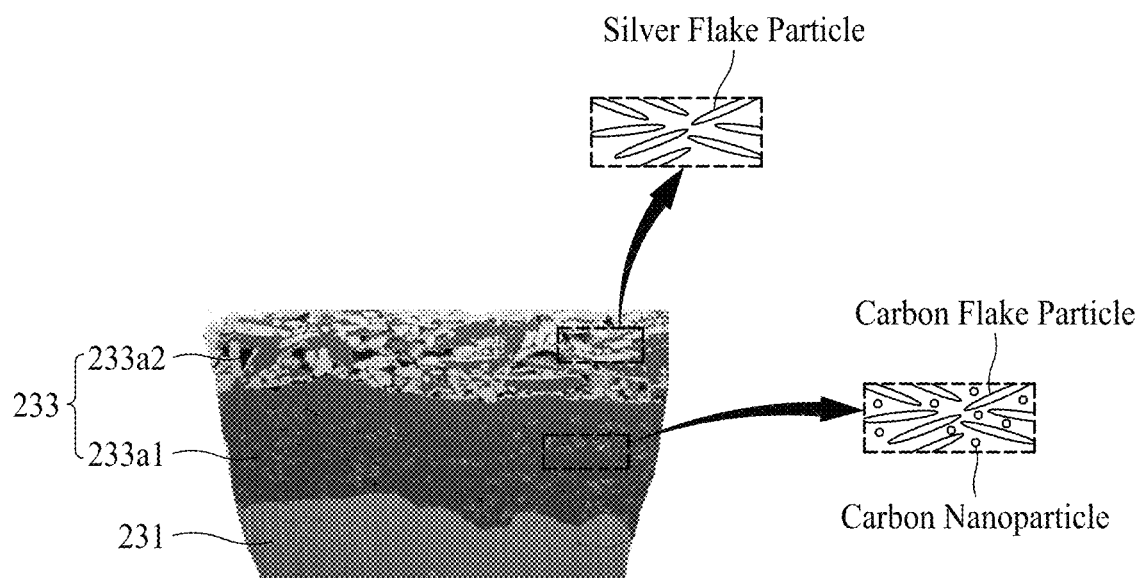
FIG. 6B is a photograph of a vibration portion and an electrode portion of the vibration generator of FIG. 6A taken with a scanning electron microscope.

FIG. 5 illustrates a vibration device according to another embodiment of the present disclosure, FIG. 6A is a cross-sectional view illustrating a vibration generator of the vibration device of FIG. 5, and FIG. 6B is a photograph of a vibration portion and an electrode portion of the vibration generator of FIG. 6A taken with a scanning electron microscope. A configuration of the vibration device of FIG. 5 is substantially the same as the configuration of FIG. 1, except for the configuration of the first electrode portion 233 and the second electrode portion 235, and thus a repeated description thereof is omitted or may be briefly provided. For example, the first and second electrode portions 233, 235 can each have two layers (e.g., a double layer).

With reference to FIGS. 5 and 6A, the vibration device according to another embodiment of the present disclosure can include a vibration generator 230, and the vibration generator 230 can include a vibration portion 231, a first electrode portion 233 disposed at a first surface of the vibration portion 231, and a second electrode portion 235 disposed at a second surface opposite to the first surface of the vibration portion 231.

The first electrode portion 233 can include a first layer 233a1 disposed adjacent to the vibration portion 231 and a second layer 233a2 disposed on the first layer 233a1. For example, the second layer 233a2 can cover the first layer 233a1. The second electrode portion 235 can include a first layer 235a1 disposed adjacent to the vibration portion 231 and a second layer 235a2 disposed at the first layer 235a1. For example, the second layer 235a2 can cover the first layer 235a1.

According to an embodiment of the present disclosure, a thickness of the first layer 233a1 of the first electrode portion can be in the range of 1 to 10 µm, or 3 to 7 µm, or be adjusted to a thickness of 5 µm. A thickness of the second layer 233a2 can be in a range of 5 to 20 µm, or 10 to 15 µm, or be adjusted to a thickness of 12.5 µm. The thickness of the first layer 233a1 can be greater than a surface roughness value of the vibration portion 231. For example, the thickness of the first layer 233a1 can be less than 5 µm, and the second layer 233a2 can be thicker than the first layer 233a1. In this disclosure, the thicknesses of the first layer 233a1 and the second layer 233a2 are not limited thereto. The first layer 233a1 of the first electrode portion and the first layer 235a1 of the second electrode portion can include a carbon particle.

The first layer 233a1 of the first electrode portion and the first layer 235a1 of the second electrode portion can be prepared by coating the vibration portion 231 using a composition including a carbon particle, a binder, a solvent, and a resin, and sintering the same. 50 to 60 wt % of a carbon particle can be included in the electrode composition for forming the first layer 233a1 and the first layer 235a1. At least a portion of the solvent can be volatilized during the sintering of the first layer 233a1 and the first layer 235a1.

According to an embodiment of the present disclosure, the carbon particle can include at least one of a carbon nanoparticle or a carbon flake particle.

The carbon nanoparticle can include carbon black or carbon nanotubes. Carbon black can have a particle size of 10 nm to 30 nm or 15 to 25 nm, and carbon nanotubes can have a particle size of 500 nm or less (e.g., 250 nm). The type of carbon nanoparticle is not limited thereto and can be applied without limitation if they have a particle size of 10 nm to 500 nm (e.g., 200 nm).

The carbon flake particle can be in the form of plate-shaped particle or particle in the form of carbon nanotubes. The carbon flake particle can be particle having an aspect ratio greater than 2. The carbon flake particle can have a particle size of 1 µm to 10 µm, 3 µm to 7 µm, or adjust to approximately 5 µm.

The ratio of carbon nanoparticle or carbon flake particle to carbon particle included in the electrode composition for forming the first layer 233a1 and the first layer 235a1 can be adjusted to 5:5 to 6:4 in consideration of electrical characteristics.

Here, the carbon particle in the first layer 233a1 of the first electrode portion and the first layer 235a1 of the second electrode portion can include at least one of a carbon nanoparticle or a carbon flake particle. Alternatively, the carbon particle in the first layer 233a1 and the first layer 235a1 can include both carbon nanoparticle and/or carbon flake particle.

According to an embodiment of the present disclosure, when the carbon particle of the first layer 233a1 of the first electrode portion and the first layer 235a1 of the second electrode portion include a carbon nanoparticle and a carbon flake particle, the carbon nanoparticle can be evenly disposed between the carbon flake particle and the interface between the vibration portion 231 and the first layer 235a1. Accordingly, the first layer 233a1 and the first layer 235a1 including the carbon particle described above can evenly fill a predetermined surface roughness formed on the first surface or the second surface of the vibration portion 231, and thus, the interface or an interfacial contact state between the first layer 233a1 of the first electrode portion and the first layer 235a1 of the second electrode portion and the vibration portion 231 can be improved.

The resistivity of the first layer 233a1 of the first electrode portion and the first layer 235a1 of the second electrode portion including a carbon particle can be about $10^{-2}$ Ω·cm and can have a high numerical value compared with resistivity of the first electrode portion 233 or the second electrode portion 235 including the silver (Ag) nanoparticle described above. Accordingly, the first layer 233a1 and the first layer 235a1 can have high sheet resistance.

According to an embodiment of the present disclosure, the second layer 233a2 of the first electrode portion and the second layer 235a2 of the second electrode portion are formed as electrodes including a conductive metal particle having high conductivity to supplement electrical characteristics of the first layer 233a1 and the first layer 235a1 including the carbon particle described above.

The second layer 233a2 of the first electrode portion and the second layer 235a2 of the second electrode portion can include conductive metal flake particle. Here, the conductive metal flake particle can be conductive metal particle having a particle size greater than 1 μm, and can have a particle size of 1 μm to 10 μm, or 3 μm to 7 μm (e.g., 5 μm). The conductive metal flake particle can be a particle with an aspect ratio greater than 2. The conductive metal flake particle can include at least one or more of silver (Ag), gold (Au), platinum (Pt), and copper (Cu).

Accordingly, the vibration device according to another embodiment of the present disclosure can include the first electrode portion 233 including the first layer 233a1 of the first electrode portion disposed adjacent to the vibration portion 231 of the configuration described above and the second layer 233a2 of the first electrode portion disposed at the first layer 233a1, and a second electrode portion 235 including a first layer 235a1 disposed adjacent to the vibration portion 231 and a second layer 235a2 disposed at the first layer 235a1. For example, the second layer 235a2 can cover the first layer 235a1. Accordingly, due to excellent interfacial contact characteristics between the vibration portion 231, the first layer 233a1, and the first layer 235a1, it can have low contact resistance Rc characteristics. In addition, the second layer 233a2 and the second layer 235a2 including a conductive metal flake particle having high conductivity can provide low resistance electrode portions having low resistance by supplementing the electrical characteristics of the first layer 233a1 and the first layer 235a1 including a carbon particle.

The conductive metal flake particle included in the second layer 233a2 of the first electrode portion and the second layer 235a2 of the second electrode portion have lower manufacturing cost compared to the conductive metal nanoparticle, thereby reducing manufacturing cost of the vibration device.

The first layer 233a1 of the first electrode portion and the first layer 235a1 of the second electrode portion can have a thickness greater than the surface roughness value of the vibration portion 231, and the second layer 233a2 of the first electrode portion and the second layer 235a2 of the second electrode portion can be adjusted or set at an appropriate level to satisfy preset electrical characteristics of the first electrode portion 233 and the second electrode portion 235.

With reference to FIG. 6B, it can be seen that the first layer 233a1 of the first electrode portion and the vibration portion 231 have an interface in a very close contact state and no voids are observed at the interface of the first layer 233a1 and the vibration portion 231.

The second layer 233a2 in the first layer 233a1 of the first electrode portion can be configured to include a silver flake particle. For example, the second layer 233a2 of the first electrode portion can cover the first layer 233a1. The silver flake particle can be low in manufacturing cost compared with the silver nanoparticle, and thus, manufacturing cost of the vibration device can be reduced.

Figure 7:
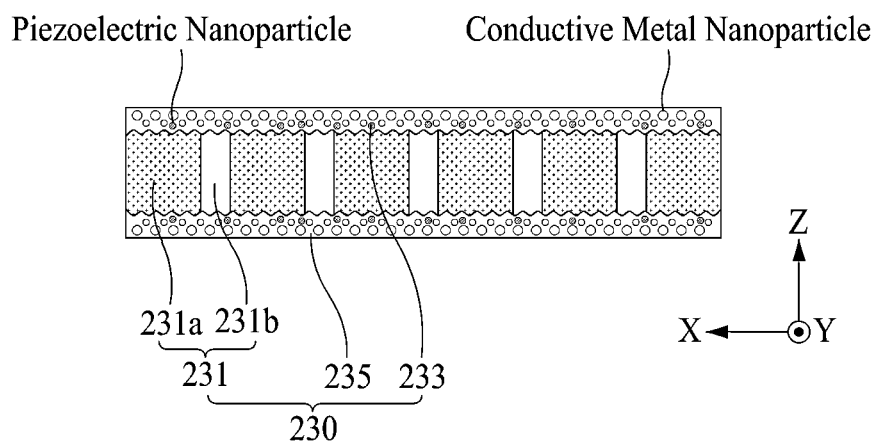
FIGS. 7 and 8 are cross-sectional views showing a structure of a vibration generator of a vibration device according to another embodiment of the present disclosure.
Figure 8:
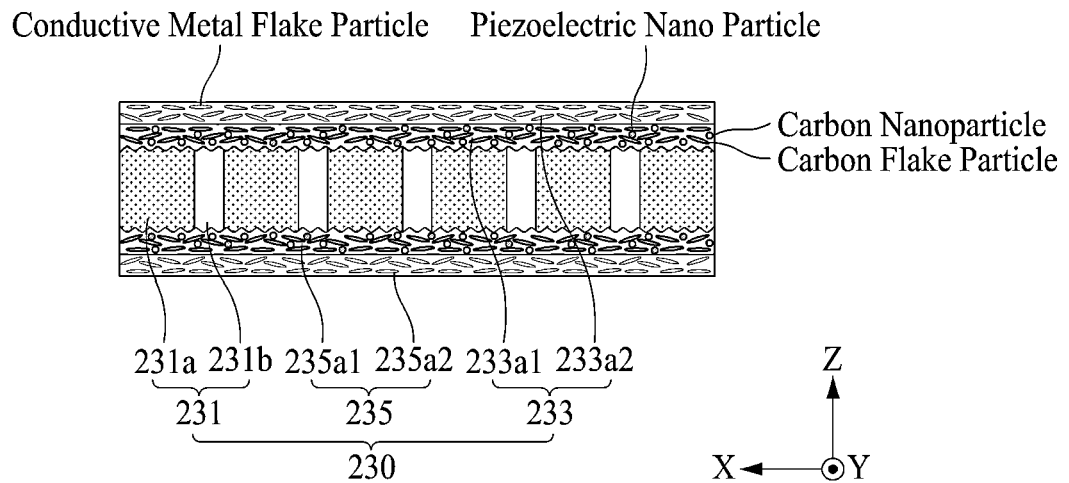

FIGS. 7 and 8 are cross-sectional views showing a structure of a vibration generator of a vibration device according to another embodiment of the present disclosure. A structure of a vibration generator of FIG. 7 is the same as that of the vibration generator of FIG. 4A except for the configuration of the first electrode portion 233 and the second electrode portion 235, and a structure of a vibration generator of FIG. 8 is the same as that of the vibration generator of FIG. 6A except for the configuration of the first electrode portion 233 and the second electrode portion 235, and thus, repeated descriptions thereof are omitted or may be briefly provided.

With reference to FIG. 7, each of the first electrode portion 233 and the second electrode portion 235 can further include a piezoelectric nanoparticle. The piezoelectric nanoparticle can include the same material as that of the inorganic vibration portion 231a. Since each of the first electrode portion 233 and the second electrode portion 235 further includes a piezoelectric nanoparticle containing the same material as that of the inorganic vibration portion 231a, interface matching characteristics between the vibration portion 231 and the first the electrode portion 233 and the second electrode portion 235 can be improved.

With reference to FIG. 8, each of the first layer 233a1 of the first electrode portion and the first layer 235a1 of the second electrode portion can further include a piezoelectric nanoparticle. The inorganic particle can include the same material as that of the inorganic vibration portion 231a. Since each of the first layer 233a1 and the first layer 235a1 further includes a piezoelectric nanoparticle including the same material as that of the inorganic vibration portion 231a, interface matching characteristics between the vibration portion 231 and the first electrode portion 233 and the second electrode portion 235 can be improved.

Figure 9:
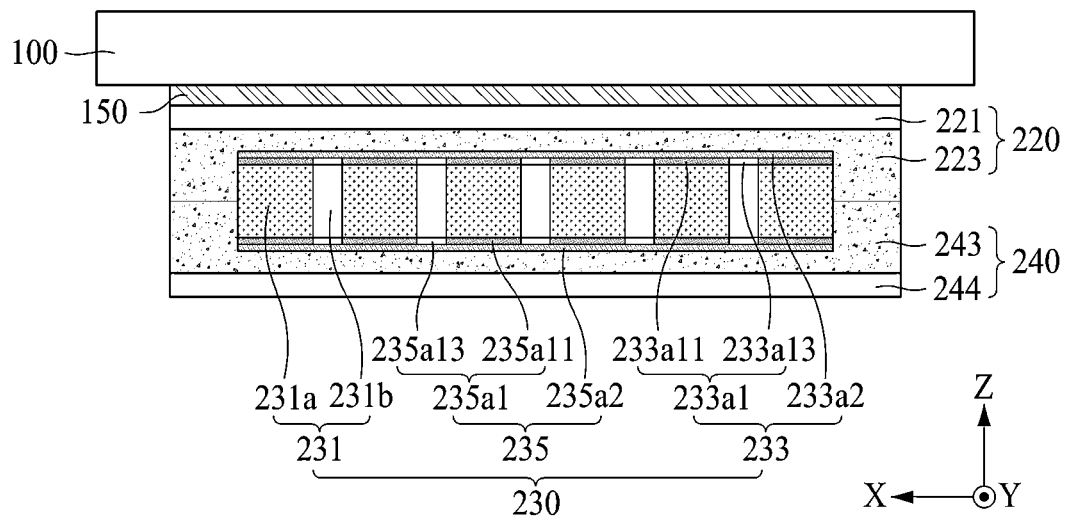
FIG. 9 illustrates a vibration device according to another embodiment of the present disclosure.
Figure 10:
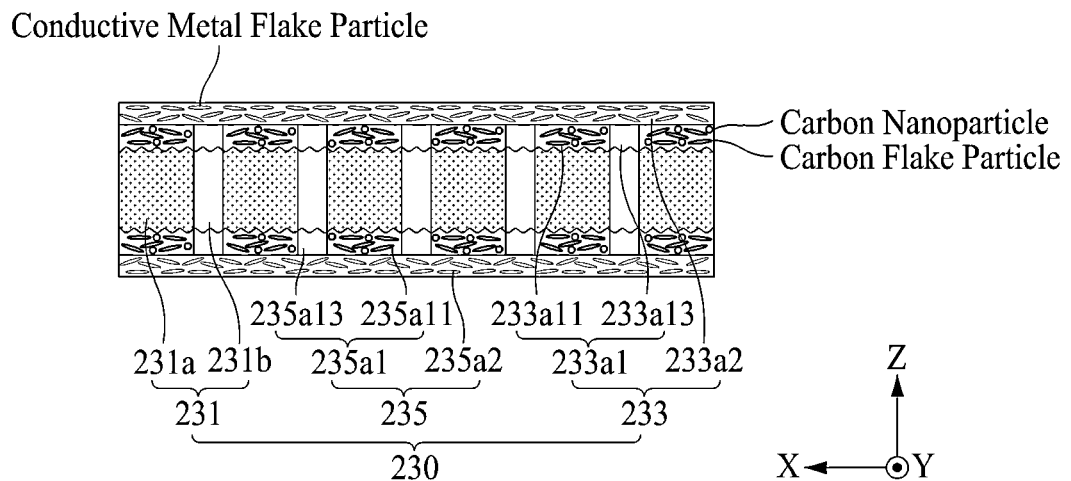
FIG. 10 is a cross-sectional view illustrating a structure of a vibration generator of the vibration device of FIG. 9.

FIG. 9 illustrates a vibration device according to another embodiment of the present disclosure, and FIG. 10 is a cross-sectional view showing a structure of a vibration generator of the vibration device of FIG. 9. The structure of the vibration generator of FIG. 9 and the structure of the vibration generator of FIG. 10 are the same as that of the vibration generator of FIG. 5 except for the configuration of the first layer 233a1 of the first electrode portion and the first layer 235a1 of the second electrode portion, a repeated description thereof is omitted or may be briefly provided.

With reference to FIGS. 9 and 10, the first layer 233a1 of the first electrode portion can include a plurality of first portions 233a11 spaced apart from each other, and a second portion 233a13 filling a space between the first portion 233a11. The first layer 235a1 of the second electrode portion can include a plurality of first portions 235a11 spaced apart from each other, and a second portion 235a13 filling a space between the first portions 235a11.

The first portion 233a11 of the first electrode portion and first portion 235a11 of the second electrode portion can have dimensions corresponding to the inorganic vibration portion 231a of the vibration portion 231. The second portion 233a13 of the first electrode portion and second portion 235a13 of the second electrode portion can have dimensions corresponding to the organic vibration portion 231b of the vibration portion 231. Here, the corresponding dimension can be a dimension in the first direction X and the second direction Y excluding the length or thickness in the third direction Z.

The second layer 233a2 disposed at the first layer 233a1 of the first electrode portion and the second layer 235a2 disposed at the first layer 235a1 of the second electrode portion can include the conductive metal flake particle described above in FIG. 5. For example, the second layer 233a2 can cover the first layer 233a1. For example, the second layer 233a2 can cover the first layer 235a1.

The first electrode portion 233 can be prepared through the following process, and the second electrode portion 235 can also be prepared through the same method as that of the first electrode portion 233.

First, the first layer 233a1 of the first electrode portion can be formed on the first surface of the vibration portion 231. Here, the first layer 233a1 can be an electrode portion including the carbon particle described above with reference to FIG. 5.

Next, the first layer 233a1 of the first electrode portion can be patterned to prepare a plurality of first portions 233a11 spaced apart from each other.

Next, the second portion 233a13 of the first electrode portion fills a space between the first portions 233a11. Here, the second portion 233a13 can be formed of a polymer material. For example, the second portion 233a13 can include a least one of an epoxy-based polymer, an acrylic-based polymer, and a silicone-based polymer, but embodiments of the present disclosure are not limited thereto.

Next, the second layer 233a2 of the first electrode portion can be formed to cover the first layer 233a1, and the second layer 233a2 can include a conductive metal flake particle.

In addition, the second electrode portion 235 can be formed on the second surface of the vibration portion 231 through the same process as that of the first electrode portion 233.

According to an embodiment of the present disclosure, the first layer 233a1 of the first electrode portion includes the second portion 233a13 including a highly flexible polymer material between the first portion 233a11 and the first portions 233a11, and the first layer 235a1 can include the second portion 235a13 including a highly flexible polymer material between the first portion 235a11 and the first portion 235a11. Accordingly, the flexibility of the vibration generator 230 including the first electrode portion 233 and the second electrode portion 235 and the vibration device can improve flexibility of the vibration generator 230 and the vibration device including the same.

Figure 11:
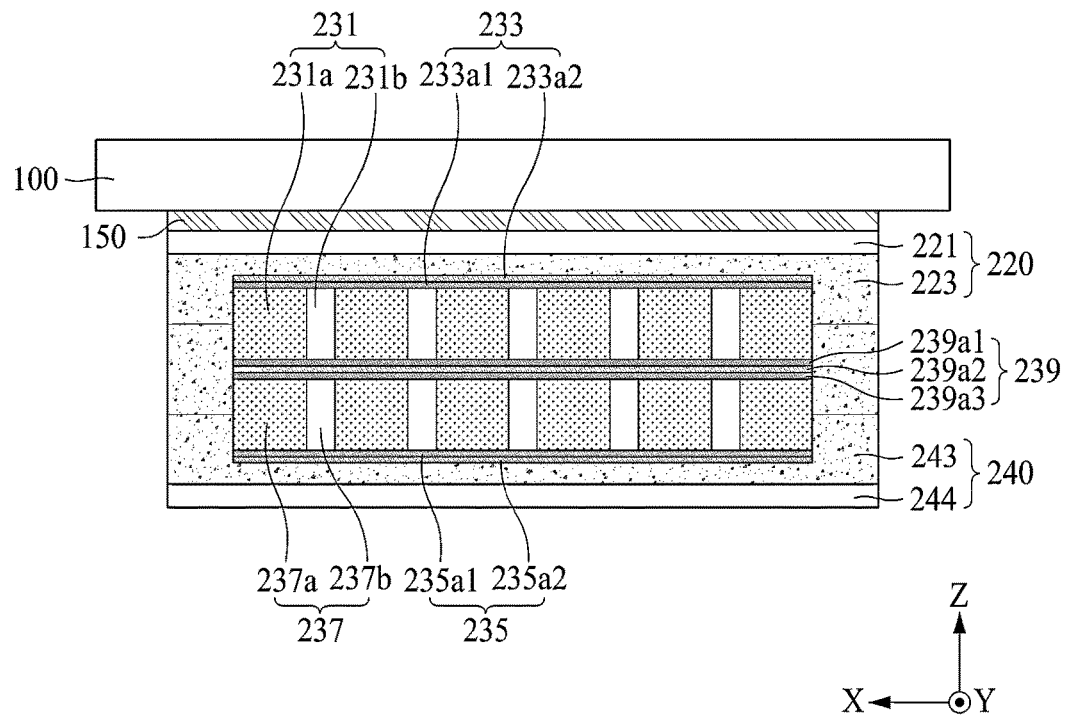
FIG. 11 illustrates a vibration device according to another embodiment of the present disclosure.
Figure 12:
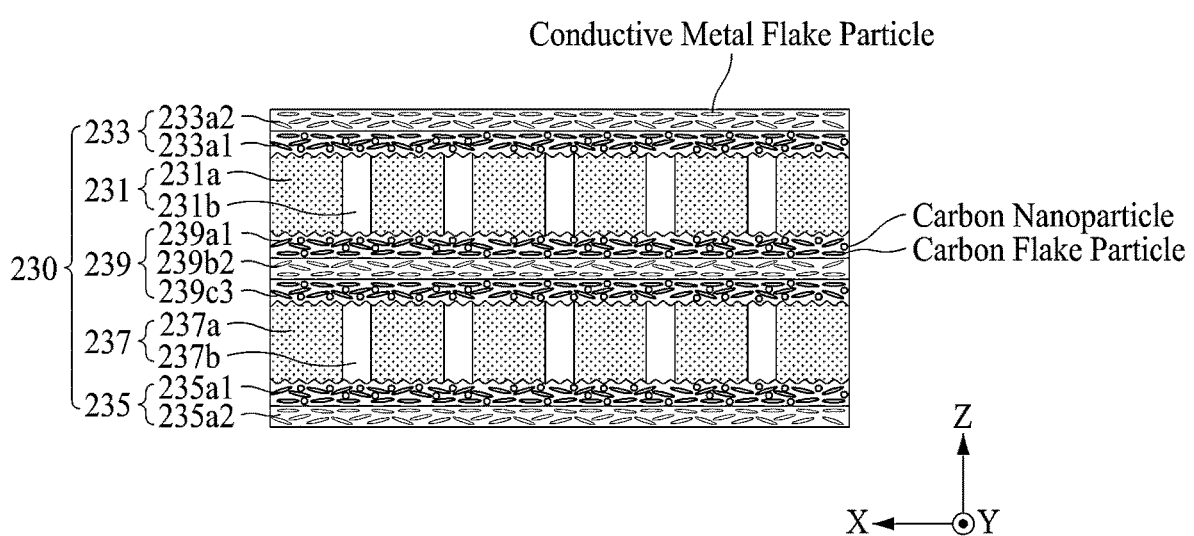
FIG. 12 is a cross-sectional view illustrating a structure of a vibration generator of the vibration device of FIG. 11.

FIG. 11 illustrates a vibration device according to another embodiment of the present disclosure, and FIG. 12 is a cross-sectional view showing a structure of a vibration generator of the vibration device of FIG. 11. The structure of the vibration device of FIGS. 11 and 12 is the same as that of the vibration device of FIG. 1, except for the structure of the vibration generator 230, and thus a repeated description thereof is omitted or can be briefly provided.

With reference to FIGS. 11 and 12, the vibration generator 230 can include a first vibration portion 231 adjacent to the vibration object 100, a second vibration portion 237 disposed at a rear surface (or a back surface) of the first vibration portion 231, a first electrode 233 disposed at the first surface (or the front surface) of the first vibration portion 231, a second electrode portion 235 disposed at the second surface of the second vibration portion 237, and a third electrode portion 239 disposed between the first vibration portion 231 and the second vibration portion 237.

Each of the first vibration portion 231 and the second vibration portion 237 can have the same configuration as the vibration portion 231 described in FIG. 1. However, the first vibration portion 231 and the second vibration portion 237 can have opposite poling directions. The poling directions of the first vibration portion 231 and the second vibration portion 237 and the behavior of the vibration device accordingly are described later with reference to FIGS. 13 and 14.

The first electrode portion 233 and the second electrode portion 235 can have the same configuration as the first electrode portion 233 and the second electrode portion 235 described in FIGS. 5 and 8 to 10. Accordingly, the first electrode portion 233 can include a first layer 233a1 including a carbon particle and a second layer 233a2 including a conductive metal flake particle. The second electrode portion 235 can include a first layer 235a1 including a carbon particle and a second layer 235a2 including a conductive metal flake particle.

The first layer 233a1 of the first electrode portion can include a plurality of first portions 233a11 spaced apart from each other and the second portion 233a13 filling a portion between the first portions 233a11. The first layer 235a1 of the second electrode portion can include a plurality of first portions 235a11 spaced apart from each other and a second portion 235a13 filling a portion between the first portions 235a11.

The third electrode portion 239 can include a first layer 239a1 in contact with the first vibration portion 231, a third layer 239a3 in contact with the second vibration portion 237, and a second layer 239a2 disposed between the first layer 239a1 and the third layer 239a3.

The first layer 239a1 and third layer 239a3 of the third electrode portion can be electrode layers including the same carbon particle as those of the first layer 233a1 of the first electrode portion and the first layer 235a1 of the second electrode portion. The second layer 239a2 can be an electrode layer including the same conductive metal flake particle as the second layer 232a2 of the first electrode portion and second layer 235a2 of the second electrode portion.

According to an embodiment of the present disclosure, a thickness of the first layer 233a1 of the first electrode portion can be within the range of 1 to 10 μm (e.g., 5 μm), and a thickness of the second layer 233a2 of the first electrode portion is within the range of 5 to 20 μm (e.g., 12 μm). The thickness of the first layer 233a1 can be greater than a surface roughness value of the vibration portion 231. For example, the thickness of the first layer 233a1 can be less than 5 μm. In this disclosure, the thicknesses of the first layer 233a1 and the second layer 233a2 are not limited thereto.

According to an embodiment of the present disclosure, a thickness of the first layer 235a1 of the second electrode portion can be within the range of 1 to 10 μm (e.g., 5 μm), and a thickness of the second layer 235a2 of the second electrode portion can be within the range of 5 to 20 μm (e.g., 12 μm). Also, the thickness of the first layer 235a1 can be greater than the surface roughness value of the vibration portion 231. For example, the thickness of the first layer 235a1 can be less than 5 μm. In this disclosure, the thicknesses of the first layer 235a1 and the second layer 235a2 are not limited thereto.

A thickness of the first layer 239a1 of the third electrode portion and the third layer 239a3 of the third electrode portion 239a3 can be adjusted to have the same as the thickness of the first layer 233a1 of the first electrode portion and the first layer 235a1 of the second electrode portion described above. A thickness of the second layer 239a2 of third electrode portion can be adjusted to be the same as the thickness of the second layer 233a2 of the first electrode portion and the second layer 235a2 of the second electrode portion described above.

In addition, according to an example of the present disclosure, the second layer 239a2 of third electrode portion can be thicker than the first layer 239a1 of the third electrode portion and the third layer 239a3 of the third electrode portion to form a flexible cable FC in the second layer 239a2.

For example, when the first layer of 239a1 the third electrode portion and the third layer 239a3 of the third electrode portion are prepared to have a thickness of 1 to 10 μm (e.g., 5 μm), the second layer 239a2 of third electrode portion can be prepared to have a thickness of 10 to 20 μm (e.g., 15 μm).

Figure 13:
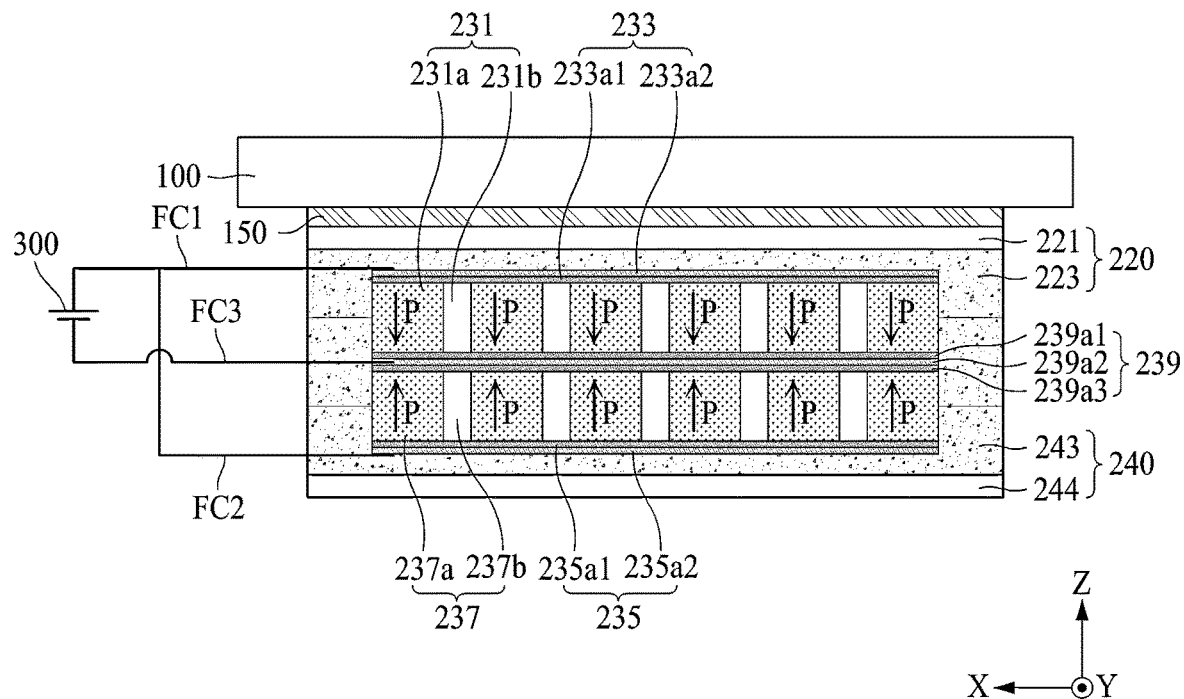
FIG. 13 illustrates a method of poling vibration portions of the vibration device of FIG. 11 according to an embodiment of the present disclosure.

FIG. 13 illustrates a method of poling vibration portions of the vibration device of FIG. 11.

With reference to FIG. 13, the first electrode portion 233, the second electrode portion 235, and the third electrode portion 239 of the vibration generator 230 can be electrically connected to the poling apparatus 300. For example, the second layer 233a2 of the first electrode portion of the vibration generator 230 can be configured to contact a first flexible cable FC1, the second layer 235a2 of the second electrode portion is configured to contact a second flexible cable FC2, and the second layer 239a2 of third electrode portion can be configured to contact a third flexible cable FC3. The first flexible cable FC1 and the second flexible cable FC2 can be electrically connected to a positive terminal of the poling apparatus 300. The third flexible cable FC3 can be electrically connected to a negative terminal of the poling apparatus 300. Accordingly, a positive voltage can be applied to the first electrode portion 233 and the second electrode portion 235, and a negative voltage can be applied to the third electrode portion 239.

Accordingly, in the first vibration portion 231, an electric field can be applied so that a poling direction is downward by a voltage applied to each of the first electrode portion 233 and the third electrode portion 239, and in the second vibration portion 237, an electric field can be applied so that a poling direction is upward by a voltage applied to each of the second electrode portion 235 and the third electrode portion 239. Thus, the first vibration portion 231 and the second vibration portion 237 can have different poling directions from each other.

A poling voltage applied in the poling apparatus 300 can be a voltage of 3 kV/mm to 6 kV/mm, and a poling time can be maintained for 1 minute to 60 minutes, but embodiments of the present disclosure are not limited thereto.

Figure 14A:
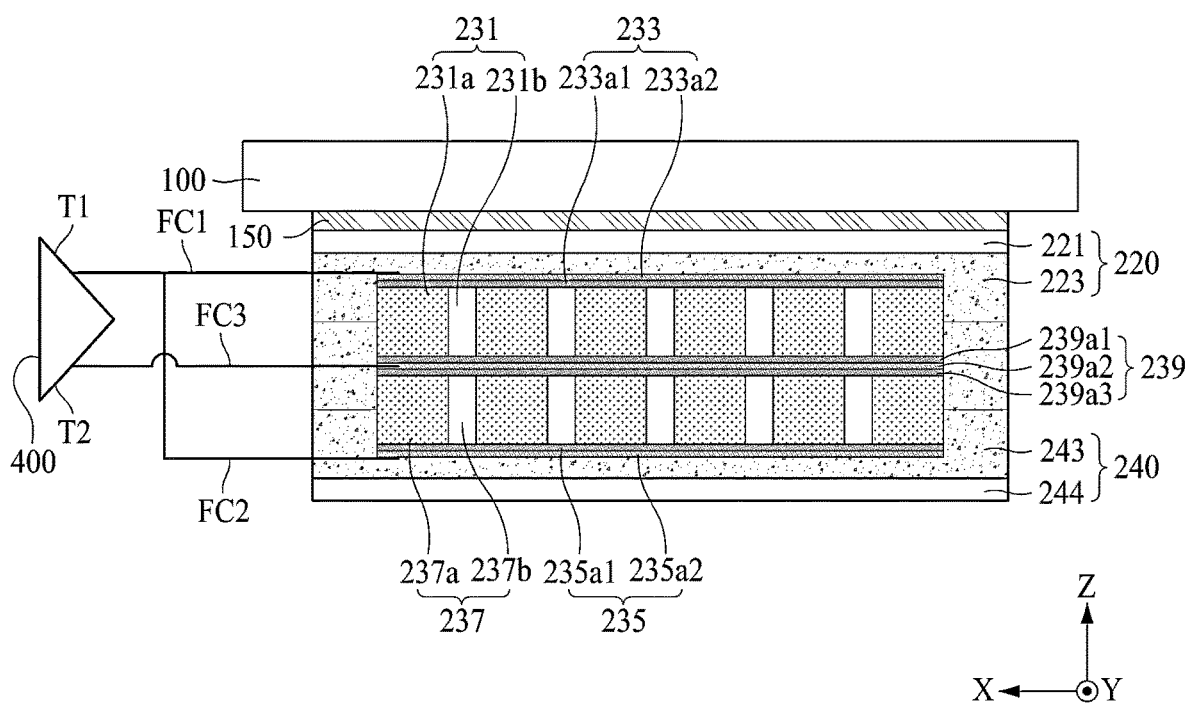
FIGS. 14A, 14B and 14C illustrate a vibration device including a vibration driving circuit, and show a behavior of a vibration generator by a voltage applied to a flexible cable, according to embodiments of the present disclosure.
Figure 14B:
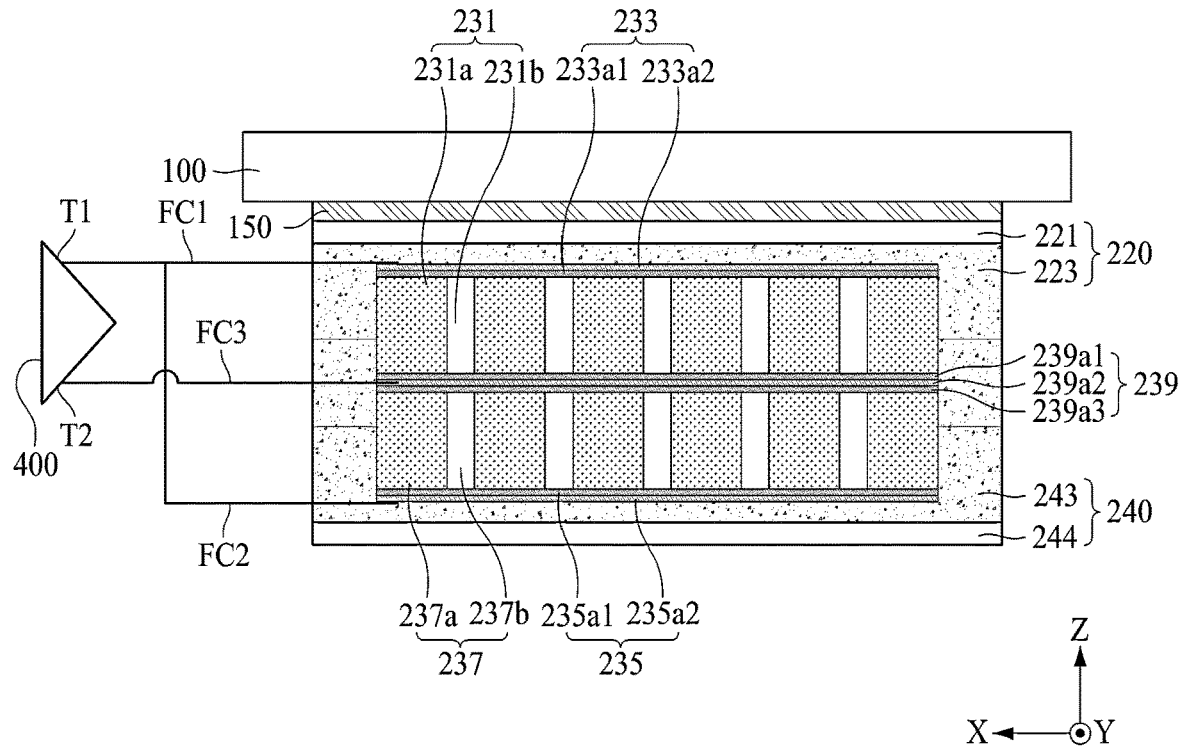
Figure 14C:
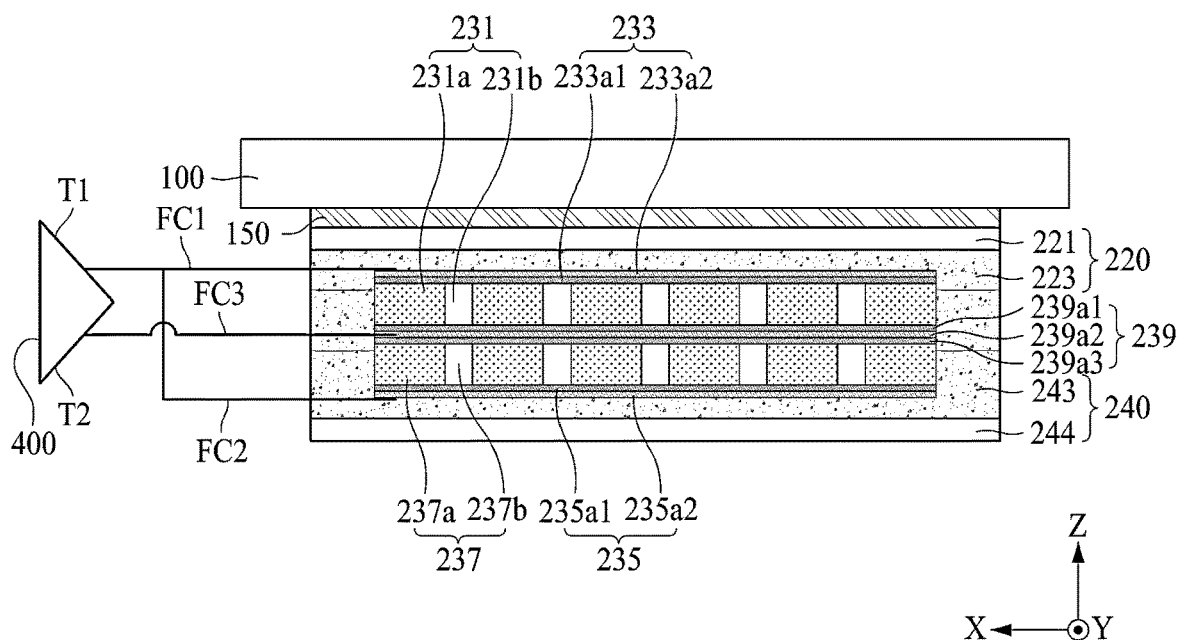

FIG. 14A illustrates a vibration device including a vibration driving circuit, and FIGS. 14B and 14C illustrate a behavior of a vibration generator by a voltage applied to a flexible cable.

With reference to FIG. 14A, the first electrode portion 233, the second electrode portion 235, and the third electrode portion 239 of the vibration generator 230 can be electrically connected to a vibration driving circuit 400. For example, the second layer 233a2 of first electrode portion of the vibration generator 230 can be configured to contact the first flexible cable FC1, the second layer 235a2 of second electrode portion can be configured to contact the second flexible cable FC2, and the second layer 239a2 of third electrode portion can be configured to contact the third flexible cable FC3. The first flexible cable FC1 and the second flexible cable FC2 can be electrically connected to a first output terminal T1 of the vibration driving circuit 400. The third flexible cable FC3 can be electrically connected to a second output terminal T2 of the vibration driving circuit 400.

Accordingly, a first polarity signal can be applied to the first electrode portion 233 and the second electrode portion 235 through the first output terminal T1 of the vibration driving circuit 400. A second polarity signal can be applied to the third electrode portion 239 through the second output terminal T2 of the vibration driving circuit 400. Here, the first polarity signal applied through the first output terminal T1 of the vibration driving circuit 400 can be any one of a positive (+) polarity signal and a negative (−) polarity signal, and a second polarity signal applied through the second output terminal T2 can be one of the positive (+) polarity signal and the negative (−) polarity signal except for the first polarity signal.

FIG. 14B shows the behavior of the vibration device when a positive (+) polarity signal is applied through the first output terminal T1 of the vibration driving circuit 400, and a negative (−) polarity signal is applied through the second output terminal T2. Accordingly, in the first vibration portion 231, an electric field is formed in a direction from the first surface to the second surface of the first vibration portion 231, and in the second vibration portion 237, an electric field is formed in a direction from the second surface toward the first surface of the second vibration portion 237.

The first vibration portion 231 and the second vibration portion 237 including the piezoelectric body can expand when an electric field is formed in the same direction as the poling direction, and thus, as shown in FIG. 14B, the first vibration portion 231 and the second vibration portion 237 can expand.

FIG. 14C shows the behavior of the vibration device when a negative (−) polarity signal is applied through the first output terminal T1 of the vibration driving circuit 400 and a positive (+) polarity signal is applied through the second output terminal T2. Accordingly, in the first vibration portion 231, an electric field is formed in a direction from the second surface of the first vibration portion 231 to the first surface, and in the second vibration portion 237, an electric field is formed in a direction from the first surface of the second vibration portion 237 to the second surface.

Since the first vibration portion 231 and the second vibration portion 237 including a piezoelectric body can contract when an electric field is formed in a direction opposite to the poling direction, the first vibration portion 231 and the second vibration portion 237 can be contracted as shown in FIG. 14C. For example, as shown in FIGS. 14A to 14C, the first and second vibration portions can expand and contract in a synchronized manner.

According to an embodiment of the present disclosure, the vibration generator including the first vibration portion 231 having a poling direction of a first direction and a second vibration portion 237 having a poling direction of a second direction opposite to the poling direction of the first vibration portion 231 can expand or contract in the same direction through a vibration driving circuit signal transferred to the first to third electrode portions, and have vibration characteristics as the piezoelectric characteristics are synchronized.

Figure 15:
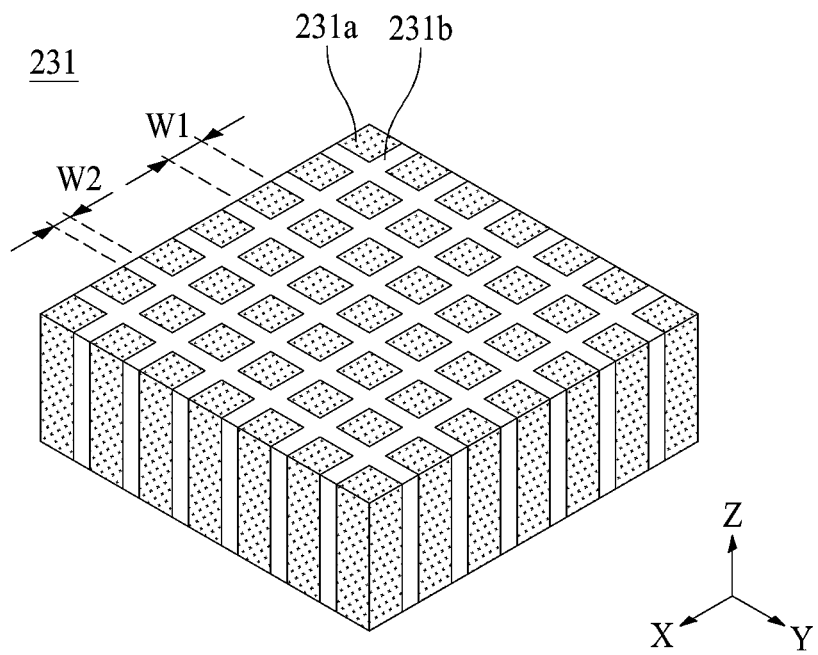
FIGS. 15 and 16 are perspective views of a vibration portion of a vibration generator according to embodiments of the present disclosure.
Figure 16:
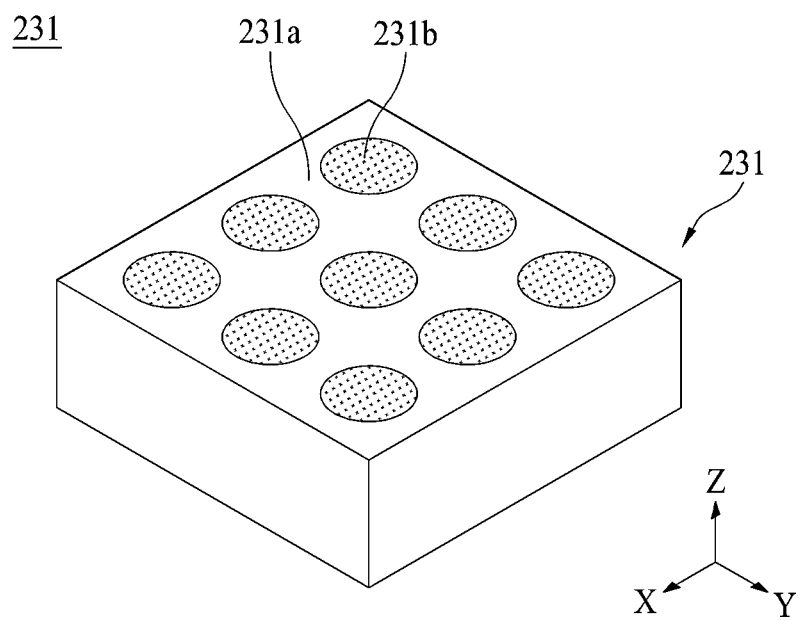

FIGS. 15 and 16 are perspective views of a vibration portion of a vibration generator according to another embodiment of the present disclosure.

With reference to FIGS. 15 and 16, the first vibration portion 231 according to another embodiment of the present disclosure can include a plurality of first portions 231a disposed to be spaced apart from each other in the first direction X and in the second direction Y and a second portion 231b disposed between the first portions 231a. The first portion 231a can be disposed in various shapes, such as a square, a rectangle, an oval, and a circle.

Each of the plurality of first portions 231a according to an embodiment of the present disclosure can have a columnar structure having a cross section of a square, rectangular, oval, or circle shape. For example, each of the plurality of first portions 231a can have a columnar structure having a cross section of a square, rectangular, oval, or circular shape, but embodiments of the present disclosure are not limited thereto. Since each of the plurality of first portions 231a is formed of substantially the same piezoelectric material as the first portion 231a described with reference to FIG. 1, the same reference numerals are given thereto and a repeated description thereof is omitted or may be briefly provided.

The plurality of second portions 231b according to an embodiment of the present disclosure can be disposed between the plurality of first portions 231a along each of the first direction X and the second direction Y. The second portion 231b can be configured to surround each of the plurality of first portions 231a, so that it can be connected to or adhered to a side surface of each of the plurality of first portions 231a. The plurality of first portions 231a and second portions 231b can be disposed (or arranged) in parallel with each other on the same plane (or on the same layer). Since the second portion 231b is formed of substantially the same organic material as the second portion 231b described with reference to FIG. 1, the same reference numerals are given thereto, and a redundant description thereof is omitted or may be briefly provided.

Therefore, in the embodiment of the present disclosure, the vibration portion 231 of the vibration generator 230 can be implemented as a vibration source (or a vibration body) having a columnar structure having a square, rectangular, oval or circular cross-section, while having a 1-3 type piezoelectric composite, and accordingly, vibration characteristics or sound output characteristics can be improved.

The description of the first vibration portion 231 of the vibration generator 230 described in FIGS. 15 and 16 can be equally applied to the second vibration portion 271 of FIG. 11.

Figure 17:
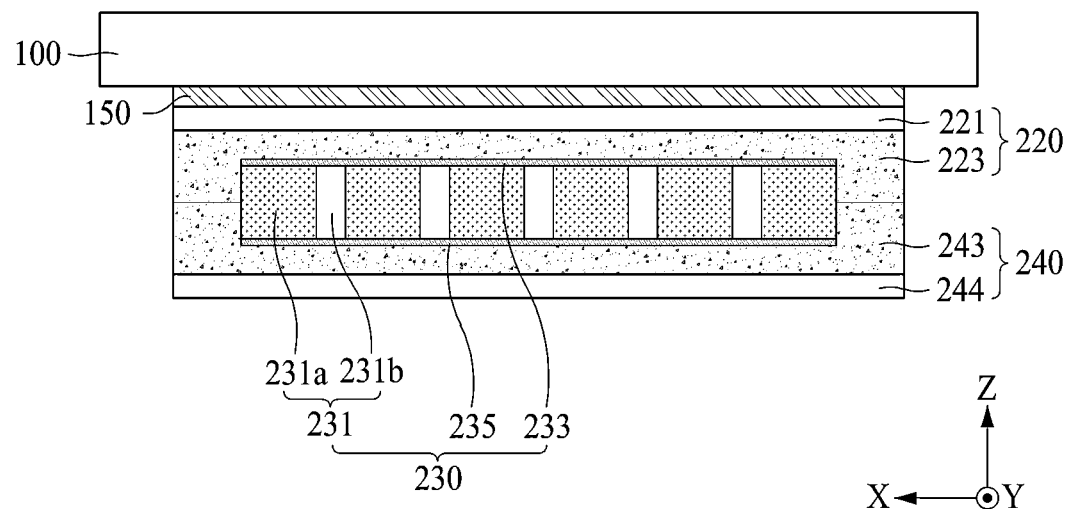
FIG. 17 illustrates a vibration device according to another embodiment of the present disclosure.
Figure 18A:
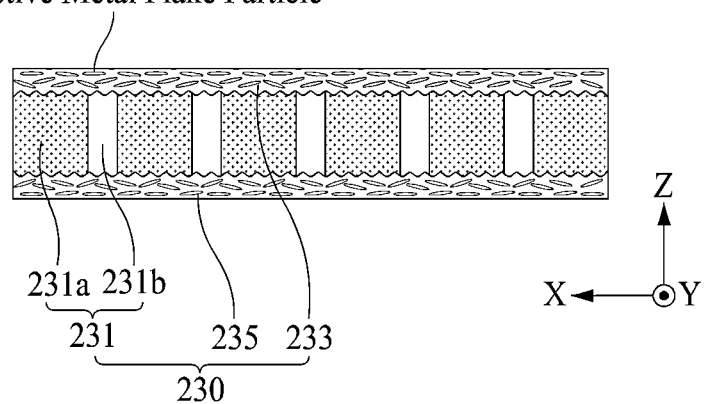
FIG. 18A is a cross-sectional view of a vibration generator according to another embodiment of the present disclosure.
Figure 18B:
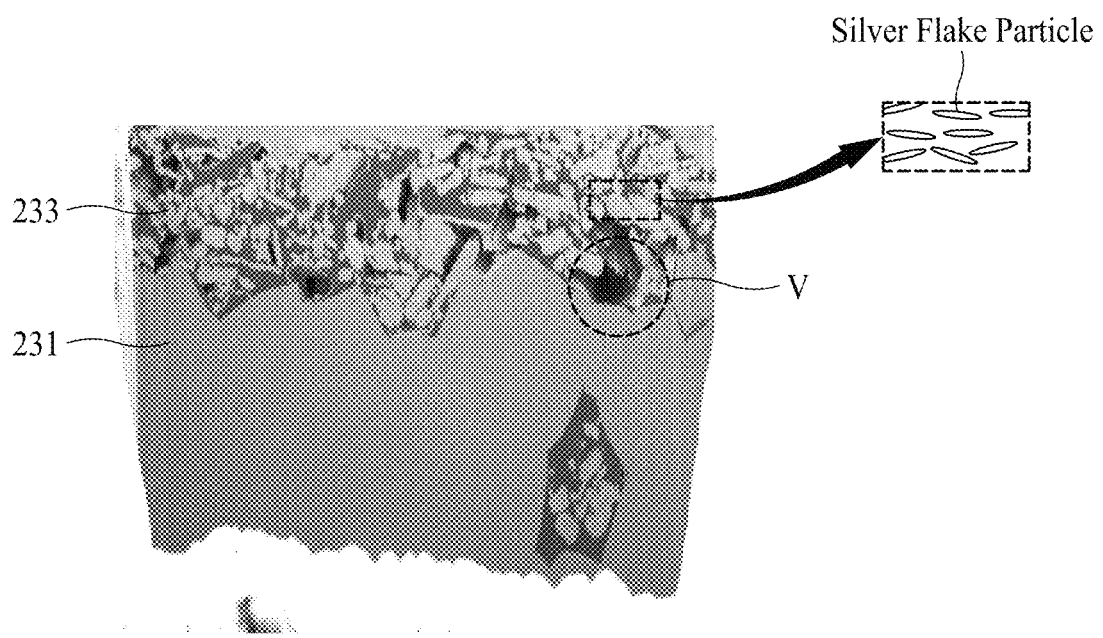
FIG. 18B is a scanning electron micrograph of a vibration generator having a structure of FIG. 18A according to an embodiment of the present disclosure.

FIG. 17 illustrates a vibration device according to another embodiment of the present disclosure, FIG. 18A is a cross-sectional view of a vibration generator according to another embodiment of the present disclosure, and FIG. 18B is a scanning electron photomicrograph of a vibration generator of the structure of FIG. 18A. In FIG. 18B, the first electrode portion 233 was prepared by applying a composition including a silver (Ag) flake particle on the first surface of the vibration portion 231 and then sintering at a temperature of 150° C.

With reference to FIG. 17, except for the configuration of the first electrode portion 233 and the second electrode portion 235, it is the same as the configuration of the vibration device of FIG. 1, and thus a redundant description thereof is omitted or may be briefly provided.

With reference to FIG. 18A, the first electrode portion 233 and the second electrode portion 235 of the vibration portion 231 of FIG. 18A can include a conductive metal flake particle and can include the same material as the second layer 233a2 and the second layer 235a2 described with reference to FIGS. 5 and 6A. The conductive metal flake particle included in the first electrode portion 233 and the second electrode portion 235 can have a particle size of 1 to 10 μm (e.g., 5 μm).

With reference to FIG. 18B, it can be seen that, when the first electrode portion 233 includes, for example, a silver flake particle having a particle size of about 4 μm, the first electrode portion 233 and at least a portion of the first surface of the vibration portion 231 are not in very close contact and a void V is formed. A silver flake particle of the first electrode portion 233 are partially in contact with the vibration portion 231, but it can be seen that, materials such as binders or resins in addition to the flake particle of the first electrode portion 233 are more in contact with the vibration portion 231.

Accordingly, with reference to the results of FIGS. 18A and 18B, when the first electrode portion 233 and the second electrode portion 235 include a conductive metal flake particle, contact resistance Rc between the first electrode portion 233 and the second electrode portion 235 and the vibration portion 231 may increase (e.g., due to the voids). When the contact resistance Rc between the first electrode portion 233 and the second electrode portion 235 and the vibration portion 231 increases, the vibration generating characteristics or the sound pressure level characteristics of the vibration device may be deteriorated.

Figure 19A:
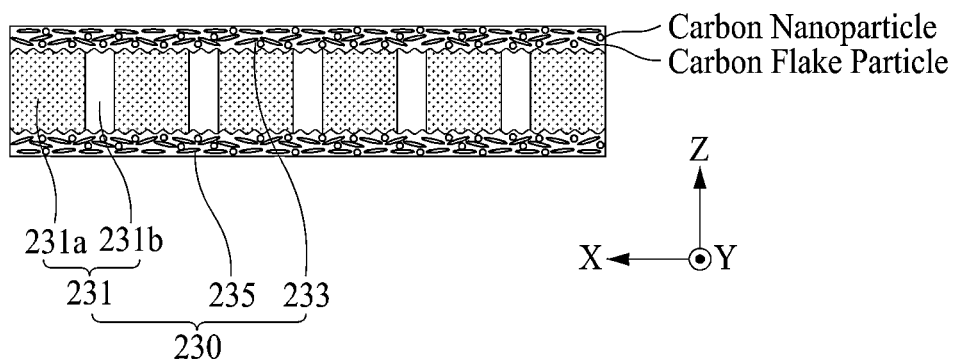
FIG. 19A is a cross-sectional view of a vibration generator according to another embodiment of the present disclosure.
Figure 19B:
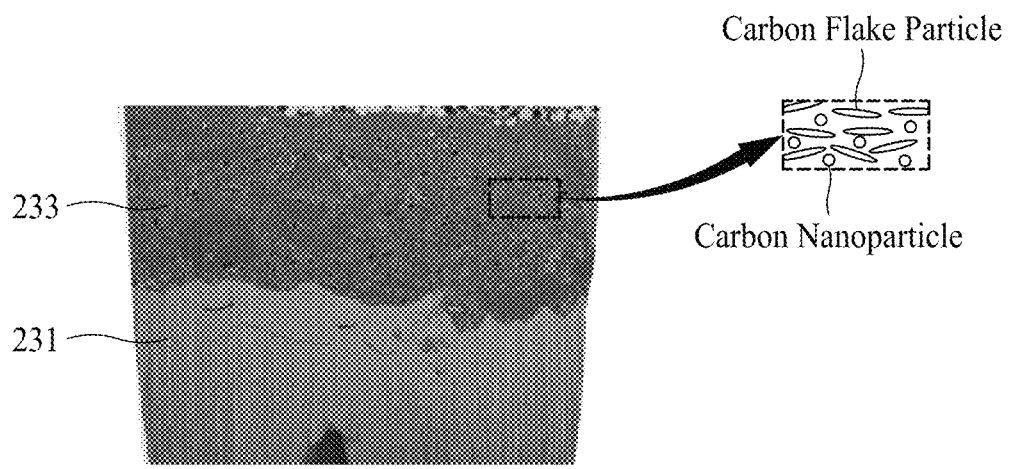
FIG. 19B is a scanning electron micrograph of a vibration generator having a structure of FIG. 19A according to an embodiment of the present disclosure.

FIG. 19A is a cross-sectional view of a vibration generator according to another embodiment of the present disclosure, and FIG. 19B is a scanning electron micrograph of the vibration generator of the structure of FIG. 19A. The vibration generator 230 of FIG. 19A can also be applied to the vibration device illustrated in FIG. 17. In FIG. 19B, the first electrode portion 233 was prepared by applying a composition including a carbon particle on the first surface of the vibration portion 231 and then sintering at a temperature of 150° C.

With reference to FIG. 19A, the first electrode portion 233 and the second electrode portion 235 of the vibration portion 231 of FIG. 19A can include at least one of a carbon nanoparticle or a carbon flake particle. The first electrode portion 233 and the second electrode portion 235 of the vibration portion 231 of FIG. 19A can include the same material as the first layer 233a1 and the first layer 235a1 described above with reference to FIGS. 5 and 6A.

With reference to FIG. 19B, it can be seen that, when the first electrode portion 233 includes a carbon black and carbon nanotubes having a particle size of 10 to 500 nm and a carbon flake particle having a particle size of 1 μm to 10 μm, the first electrode portion 233 and the vibration portion 231 are formed to be in very close contact with each other.

Accordingly, when the first electrode portion 233 and the second electrode portion 235 are configured to include a carbon particle, the first electrode portion 233 and the second electrode portion 235 and the vibration portion 231 are formed to be in close contact with each other, so that contact resistance Rc can be reduced (e.g., since there are no voids at the interface and the connection is improved).

Figure 20A:
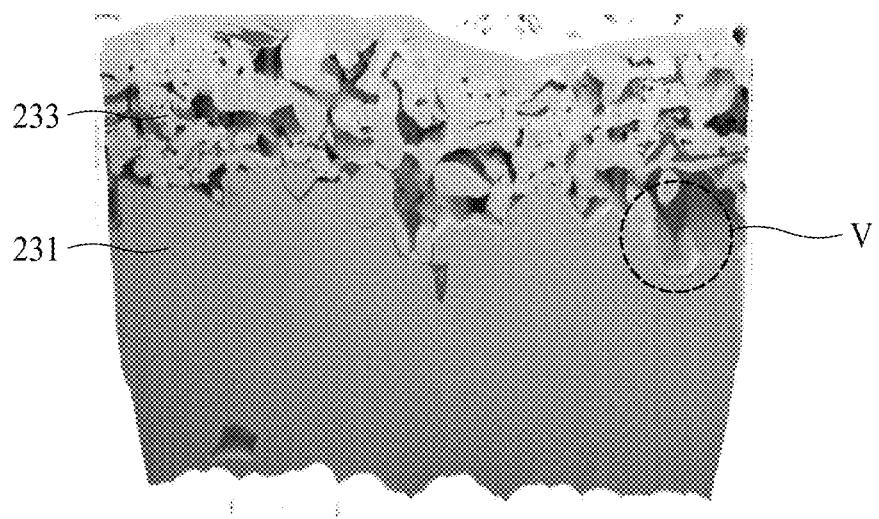
FIGS. 20A and 20B are scanning electron micrographs taken after preparing by changing a sintering temperature of an electrode portion of the vibration generator having the structure of FIG. 18A according to an embodiment of the present disclosure.
Figure 20B:
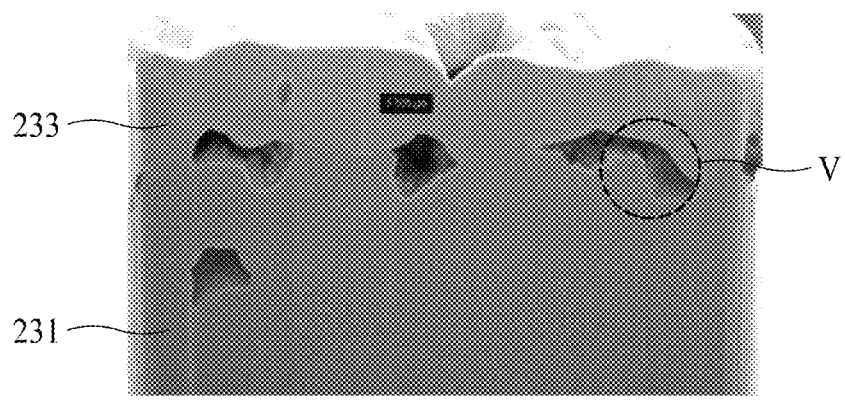

FIGS. 20A and 20B are scanning electron micrographs taken after preparing by changing a sintering temperature of the electrode portion of the vibration generator of the structure of FIG. 18A. The scanning electron micrograph of the vibration generator of FIG. 20A is a photograph taken after forming the first electrode portion 233 using the same composition including a silver flake particle as the first electrode portion 233 of FIG. 18A and then sintering it at a temperature of 350° C. The scanning electron micrograph of the vibration generator of FIG. 20B is a photograph taken after forming the first electrode portion 233 using the same composition including a silver flake particle as the first electrode portion 233 of FIG. 18A and then sintering it at a temperature of 650° C.

Comparing the scanning electron micrograph of FIG. 20A with the scanning electron micrograph of FIG. 19B, it can be seen that the ratio of voids V is further increased in the scanning electron micrograph of FIG. 20A. As described above, when the electrode portion includes a conductive metal flake particle, it can be prepared by applying a composition including a conductive metal flake particle on the first and second surfaces of the vibration portion 231 and then sintering the same. The composition including the conductive metal flake particle can include a conductive metal flake particle, a binder, a solvent, a resin, a fatty acid silver salt, and the like, and the organic material-based material such as the binder, the solvent, and the resin can be volatilized at a temperature of 350° C. Therefore, if the temperature for sintering the composition including the conductive metal flake particle applied to the electrode portion is set to 350° C., the internal voids can increase in large amounts to increase contact resistance to reduce the reliability of the vibration device.

Comparing the scanning electron micrograph of FIG. 20B with the scanning electron micrograph of FIG. 20A, it can be seen that voids having an increased size are observed in the scanning electron micrograph of FIG. 20B and a silver is partially melted and boundaries between particle are not observed.

Figure 21A:
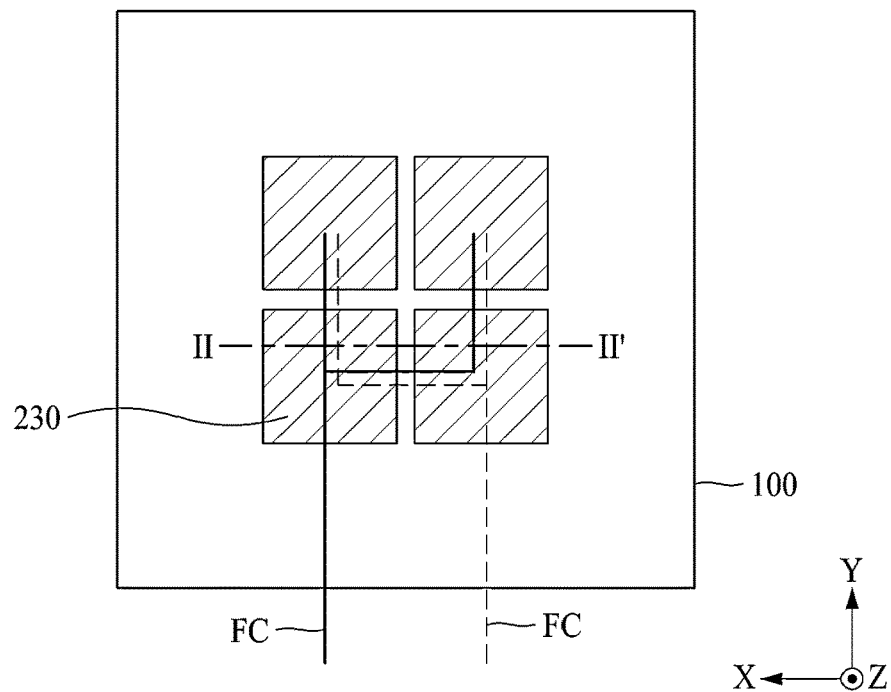
FIGS. 21A and 21B illustrate experimental conditions for measuring acoustic characteristics of a vibration device.
Figure 21B:
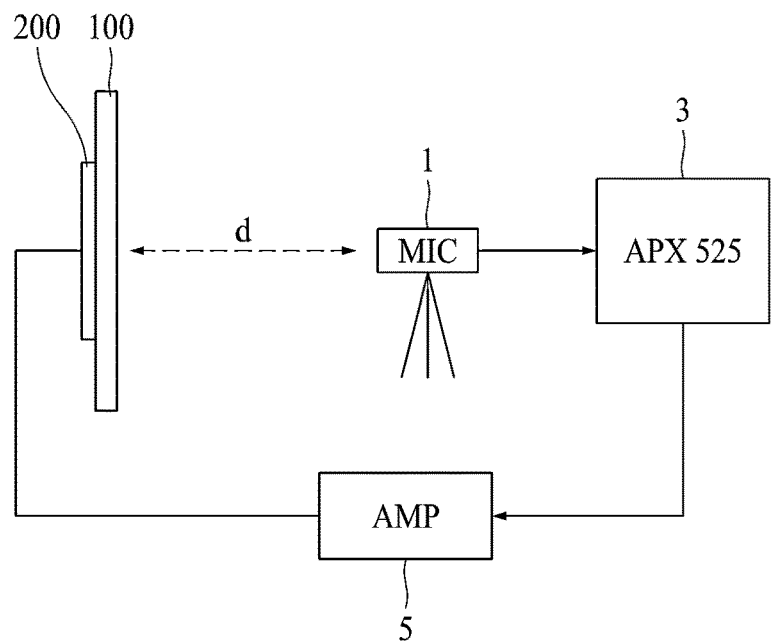

FIGS. 21A and 21B illustrate experimental conditions for measuring acoustic characteristics of a vibration device.

With reference to FIG. 21A, a square vibration device having a width of 60 mm horizontally and vertically on one surface of the vibration object 100 was arranged in two rows and two columns in a tile form into four arrays and connected in parallel. Vibration portions of the vibration device were formed to have a thickness of about 150 μm. The vibration device was attached to the vibration object 100 using an adhesive-based double-sided tape as the connection member 150. In addition, a flexible cable FC was electrically connected to each of the electrode portions of the vibration portions.

With reference to FIG. 21B, sound pressure level measurement was performed using a commercial equipment, Audio Precision's APX525 device, an input voltage was set to 5 Vrms, a signal was amplified and applied through an amplifier AMP to the vibration device 200 within a range of 150 Hz to 8 kHz of sine sweep, an average sound pressure level was measured using a microphone (MIC) at a location 30 cm away from the vibration object 100, and the measured sound pressure level was recorded using the APX525 of Audio Precision Corp. The measured sound pressure level was corrected by ⅓ octave smoothing. The sine sweep can be a method of sweeping in a short time, but embodiments of the present disclosure are not limited thereto.

Figure 22:
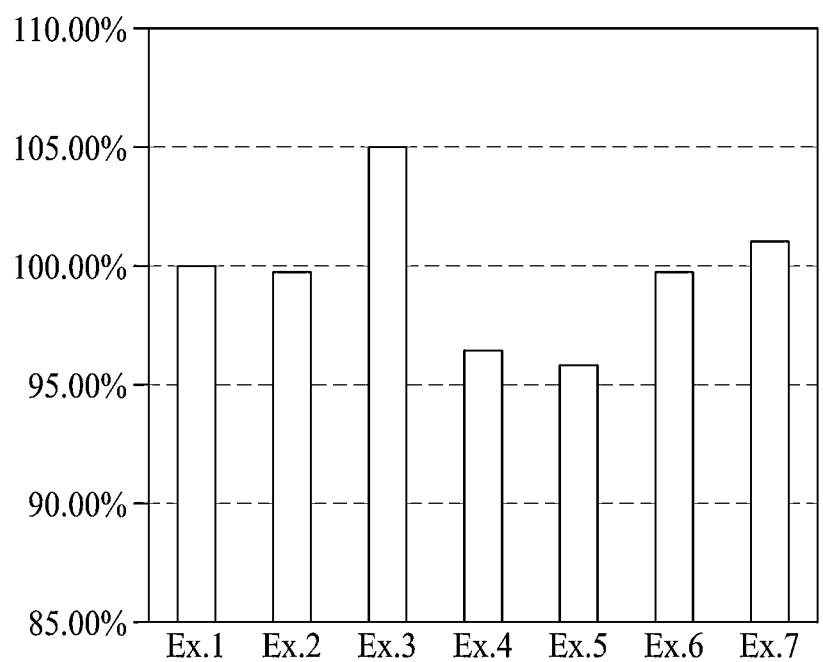
FIG. 22 is a relative bar graph showing acoustic characteristics of vibration devices of Examples 1 to 7.

FIG. 22 is a relative bar graph showing acoustic characteristics of the vibration devices of first to seventh embodiments.

In FIG. 22, a first embodiment (Ex. 1) is shown based on 100% based on average sound pressure level in the frequency range of 150 Hz to 8 kHz of the vibration device including the first electrode portion 233 including a silver nanoparticle and the second electrode portion 235 described above in FIGS. 1, 4A, and 4B. Here, the first electrode portion 233 and the second electrode portion 235 were prepared by sintering at a temperature of 150° C.

Next, in the second embodiment (Ex. 2), an average sound pressure level of the vibration device including the first layer 233a1 of the first electrode portion including a carbon particle and the first layer 235a1 of the second electrode portion and the second layer 233a2 of the first electrode portion including a silver flake particle and the second layer 235a2 of the second electrode portion described above in FIGS. 5, 6A and 6B within a frequency range of 150 Hz to 8 kHz, as a relative ratio for the first embodiment (Ex. 1). Here, the first layer 233a1 including a carbon particle and the first layer 235a1 including a carbon particle, and the second layer 233a2, and the second layer 235a2 including a silver flake particle were prepared by sintering at a temperature of 150° C. The second embodiment (Ex. 2) exhibited an average sound pressure level value of about 99.73% compared to the first embodiment (Ex. 1).

Sheet resistance of the first electrode portion 233 and the second electrode portion 235 of the second embodiment (Ex. 2) was measured to be 10.5Ω/□, and capacitance of the vibration portion 231 of the four arrays arranged in two rows and two columns was measured to be 3.53 μF. Capacitance of the vibration portion 231 according to an embodiment of the present disclosure can be 3 to 4 μF.

Next, in the third embodiment (Ex. 3), an average sound pressure level of the vibration device including the first vibration portion 231, the second vibration portion 237, the first electrode portion 233, the second electrode portion 235, and the third electrode portion 239 described in FIGS. 9 and 10 within a frequency range of 150 Hz to 8 kHz are illustrated based on a relative ratio for the first embodiment (Ex. 1). Here, the first electrode portion 233, the second electrode portion 235, and the third electrode portion 239 were prepared by sintering at a temperature of 150° C.

In the situation of the third embodiment of FIG. 22, the structure of the vibration device including the vibration generator 230 including the first vibration portion 231 and the second vibration portion 237 described in FIG. 14 is applied. As described above, a first polarity signal of any one of a positive (+) polarity signal and a negative (−) polarity signal can be applied to the first electrode portion 233 and the second electrode portion 235, and one second polarity signal other than the first polarity signal among the positive (+) polarity signal and the negative (−) polarity signal can be applied to the third electrode portion 239.

The third embodiment (Ex. 3) exhibited an average sound pressure level value of about 10.4.95% compared to the first embodiment (Ex. 1).

Sheet resistance of the first electrode portion 233 and the second electrode portion 235 of the third embodiment (Ex. 3) was measured to be 2.7Ω/□, and capacitances of the first vibration portion 231 and the second vibration portion 237 of the four arrays arranged in two rows and two columns were measured to be 3.63 μF and 3.65 μF, respectively. The capacitance of the first vibration portion 231 and the second vibration portion 237 according to an embodiment of the present disclosure can be 3 to 4 µF.

Next, in the fourth embodiment (Ex. 4), an average sound pressure level of the vibration device including the first electrode portion 233 and the second electrode portion 235 including the silver flake particle described in FIGS. 17, 18A, and 18B within a frequency range of 150 Hz to 8 kHz is illustrated based on a relative ratio for the first embodiment (Ex. 1). Here, the first electrode portion 233 and the second electrode portion 235 were prepared by sintering at a temperature of 150° C. The fourth embodiment (Ex. 4) exhibited an average sound pressure level value of about 96.39% compared to the first embodiment (Ex. 1).

Sheet resistance of the first electrode portion 233 and the second electrode portion 235 of the fourth embodiment (Ex. 4) was measured to be 0.2Ω/☐, and capacitance of the vibration portions 231 of the four arrays arranged in two rows and two columns was measured to be 3.28 µF. The capacitance of the vibration portion 231 according to an embodiment of the present disclosure can be 3 to 4 µF.

As a result of the sound pressure level measurement of the fourth embodiment (Ex. 4), when the sheet resistance values of the first electrode portion 233 and the second electrode portion 235 and the capacitance value of the vibration portion 231 of the fourth embodiment (Ex. 4) are put together, it can be seen that the first electrode portion 233 and the second electrode portion 235 of the vibration device 200 of the fourth embodiment (Ex. 4) exhibit low sheet resistance characteristics but the sound pressure level characteristic is deteriorated due to the high contact resistance Rc between the first electrode portion 233 and the second electrode portion 235 and the vibration portion 231.

Next, in the fifth embodiment (Ex. 5), an average sound pressure level of the vibration device including the first electrode portion 233 and the second electrode portion 235 including a carbon particle described in FIGS. 19A and 19B within a frequency range of 150 Hz to 8 kHz is illustrated based on a relative ratio for the first embodiment (Ex. 1). Here, the first electrode portion 233 and the second electrode portion 235 were prepared by sintering at a temperature of 150° C. The fifth embodiment (Ex. 5) exhibited an average sound pressure level value of about 95.85% compared to the first embodiment (Ex. 1).

Sheet resistance of the first electrode portion 233 and the second electrode portion 235 of the fifth embodiment (Ex. 5) was measured to be 128Ω/☐, and capacitance of the vibration portions 231 of the four arrays arranged in two rows and two columns was measured to be 3.25 µF. The capacitance of the vibration portion 231 according to an embodiment of the present disclosure can be 3 to 4 µF.

As a result of the sound pressure level measurement of the fifth embodiment (Ex. 5), when the sheet resistance values of the first electrode portion 233 and the second electrode portion 235 and the capacitance value of the vibration portion 231 of the fifth embodiment (Ex. 5) are put together, it can be seen that sound pressure level characteristics are degraded due to the high sheet resistance characteristics of the first electrode portion 233 and the second electrode portion 235 of the vibration device.

Next, in the sixth embodiment (Ex. 6), an average sound pressure level of the vibration device including the first electrode portion 233 and the second electrode portion 235 including a silver flake particle described in FIG. 20A within a frequency range of 150 Hz to 8 kHz is illustrated based on a relative ratio for the first embodiment (Ex. 1). Here, the first electrode portion 233 and the second electrode portion 235 were prepared by sintering at a temperature of 350° C.

The sixth embodiment (Ex. 6) exhibited an average sound pressure level value of about 99.73% compared to the first embodiment (Ex. 1).

Next, in the seventh embodiment (Ex. 7), an average sound pressure level of the vibration device including the first electrode portion 233 and the second electrode portion 235 including a silver flake particle described in FIG. 20B within a frequency range of 150 Hz to 8 kHz is illustrated based on a relative ratio for the first embodiment (Ex. 1). Here, the first electrode portion 233 and the second electrode portion 235 were prepared by sintering at a temperature of 650° C. The seventh embodiment (Ex. 7) exhibited an average sound pressure level value of about 101.07% compared to the first embodiment (Ex. 1).

Sheet resistance of the first electrode portion 233 and the second electrode portion 235 of the seventh embodiment (Ex. 7) was measured to be less than 0.1 Ω/cm, and capacitance of the vibration portion 231 of the four arrays arranged in two rows and two columns was measured to be 3.52 µF. The capacitance of the vibration portion 231 according to an embodiment of the present disclosure can be 3 to 4 µF.

As a result of the sound pressure level measurement of the seventh embodiment (Ex. 7), when the sheet resistance values of the first electrode portion 233 and the second electrode portion 235 and the capacitance value of the vibration portion 231 of the seventh embodiment (Ex. 7) are put together, it can be seen that the sheet resistance is greatly reduced by the high-temperature process in spite of voids V formed between the first electrode portion 233 and the second electrode portion 233 and the vibration portion 231 of the vibration device 200, and thus, the sound pressure level characteristic is expected to be improved.

Figure 23:
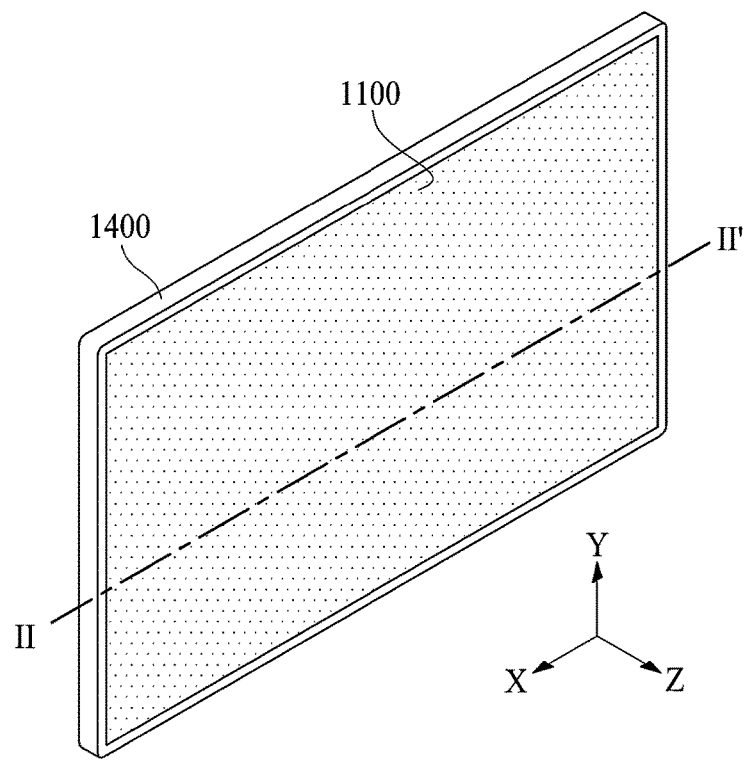
FIG. 23 illustrates an apparatus according to an embodiment of the present disclosure.
Figure 24:
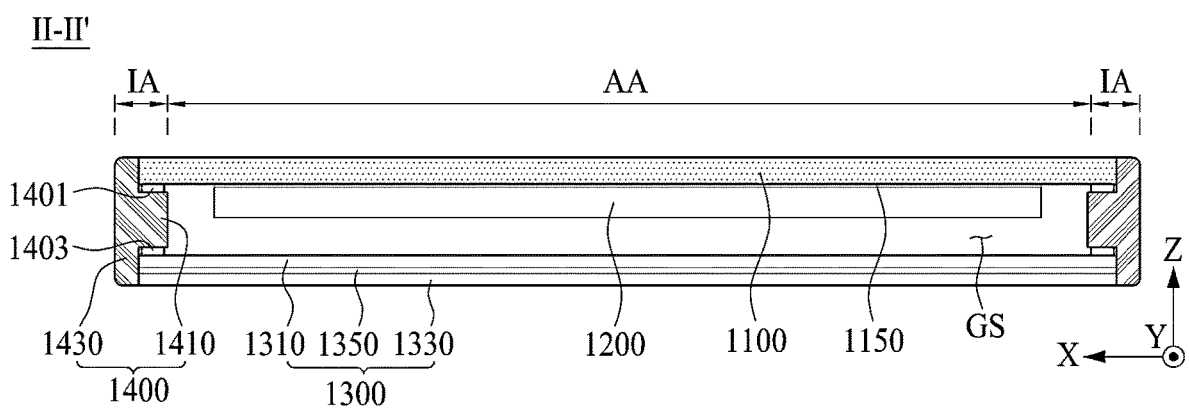
FIG. 24 is a cross-sectional view taken along line II-II' of FIG. 23.

FIG. 23 illustrates an apparatus according to an embodiment of the present disclosure, and FIG. 24 is a cross-sectional view taken along line II-II' of FIG. 23.

With reference to FIGS. 23 and 24, an apparatus (or a display apparatus) according to an embodiment of the present disclosure includes a display panel (or a vibration object) 1100 displaying an image and a vibration generating device 1200 vibrating the display panel 1100 on a rear surface (or a back surface) of the display panel 1100.

The display panel 1100 can display an image, for example, an electronic image or a digital image. For example, the display panel 1100 can display an image by outputting light. The display panel 1100 can be any type of display panel or a curved display panel such as a liquid crystal display panel, an organic light emitting display panel, a quantum dot light emitting display panel, a micro light emitting diode display panel, and an electrophoretic display panel. The display panel 1100 can be a flexible display panel. For example, the display panel 1100 can be a flexible light emitting display panel, a flexible electrophoretic display panel, a flexible electrowetting display panel, a flexible micro light emitting diode display panel, or a flexible quantum dot light emitting display panel, but embodiments of the present disclosure are not limited thereto.

The display panel 1100 according to an embodiment of the present disclosure can include a display area AA configured to display an image according to driving of a plurality of pixels. Also, the display panel 1100 can further include a non-display area IA surrounding the display area AA, but embodiments of the present disclosure are not limited thereto.

The display panel 1100 according to an embodiment of the present disclosure can include a pixel array portion disposed on the display area AA of the substrate. The pixel array portion can include a plurality of pixels that display an image according to signals supplied to signal lines. The signal lines can include, but embodiments of the present disclosure are not limited to, a gate line, a data line, and a pixel driving power line.

Each of the plurality of pixels can include a pixel circuit layer including a driving thin film transistor (TFT) provided in a pixel area formed by a plurality of gate lines and/or a plurality of data lines, a first electrode (or pixel electrode) electrically connected to the driving thin film transistor (TFT), a light emitting device formed on the first electrode, and a second electrode (or a common electrode) electrically connected to the light emitting device.

The light emitting device according to an embodiment of the present disclosure can include an organic light emitting device layer formed on the first electrode. The organic light emitting device layer can be implemented to emit light of the same color, for example, white, for each pixel, or can be implemented to emit light of a different color, for example, red, green, or blue light for each pixel.

A light emitting device according to another embodiment can include a micro light emitting diode device electrically connected to each of the first electrode and the second electrode. The micro light emitting diode device can be a light emitting diode implemented in the form of an integrated circuit (IC) or a chip. The micro light emitting diode device can include a first terminal electrically connected to a first electrode and a second terminal electrically connected to a second electrode.

The display panel 1100 according to another embodiment can include a first substrate, a second substrate, and a liquid crystal layer. The first substrate can be an upper substrate or a thin film transistor TFT array substrate. For example, the first substrate can include a pixel array having a plurality of pixels formed in pixel areas intersected by a plurality of gate lines and/or a plurality of data lines. Each of the plurality of pixels can include a thin film transistor TFT connected to a gate line and/or a data line, a pixel electrode connected to the thin film transistor TFT, and a common electrode formed adjacent to the pixel electrode to supply a common voltage. The second substrate can be a lower substrate or a color filter array substrate. For example, the second substrate can include a pixel including an opening region overlapping with the pixel area formed on the first substrate and a color filter layer formed in the opening region. The liquid crystal layer can be disposed between the first substrate and the second substrate. The liquid crystal layer can be formed of a liquid crystal in which an arrangement direction of liquid crystal molecules is changed according to an electric field formed by a data voltage and a common voltage applied to the pixel electrode for each pixel.

The vibration generating device 1200 can provide acoustic and/or haptic feedback to the user based on the vibration of the display panel 1100 by vibrating the display panel 1100 on the rear surface of the display panel 1100. The vibration generating device 1200 can be implemented on the rear surface of the display panel 1100 to directly vibrate the display panel 1100.

As an embodiment of the present disclosure, the vibration generating device 1200 can vibrate according to a vibration driving signal synchronized with an image displayed on the display panel 1100 to vibrate the display panel 1100. As another embodiment, the vibration generating device 1200 can vibrate according to a haptic feedback signal (or tactile feedback signal) synchronized with a user's touch on the touch panel (or touch sensor layer) disposed on the display panel 1100 or built in the display panel 1100 to vibrate the display panel 1100. Accordingly, the display panel 1100 can vibrate according to the vibration of the vibration generating device 1200 to provide at least one of acoustic and haptic feedbacks to a user (or a viewer).

The vibration generating device 1200 according to an example can be implemented with a size corresponding to a display area AA of the display panel 1100. The size of the vibration generating device 1200 can be 0.9 to 1.1 times the size of the display area AA, but embodiments of the present disclosure are not limited thereto. For example, the size of the vibration generating device 1200 can be the same as or smaller than the size of the display area AA. For example, since the size of the vibration generating device 1200 can be the same as or substantially the same as the size of the display area AA of the display panel 1100, it can cover most of the display panel 1100 and, since the vibration generated by the vibration generating device 1200 can vibrate the entire display panel 1100, a sense of localization of sound can be high and user satisfaction can be improved. The vibration device can have a rectangular shape that can be substantially the same size as a rectangular shaped display. In addition, since a contact area (or panel coverage) between the display panel 1100 and the vibration generating device 1200 increases to increase a vibration area of the display panel 1100, the sound in the low and mid-register range generated according to vibration of the display panel 1100 can be improved. In addition, since the vibration generating device 1200 applied to a large display apparatus can vibrate the entire large (or large area) display panel 1100, localization of the sound according to the vibration of the display panel 1100 can be further improved to implement improved sound effects.

Since the vibration generating device 1200 according to an embodiment of the present disclosure can include one or more of the vibration devices described with reference to FIGS. 1 to 22, a redundant description thereof is omitted or may be briefly provided.

The apparatus according to an embodiment of the present disclosure can further include a connection member 1150 disposed between the display panel 1100 and the vibration generating device 1200.

The connection member 1150 can be disposed between the display panel 1100 and the vibration generating device 1200 to connect or couple the vibration generating device 1200 to a rear surface of the display panel 1100. For example, the vibration generating device 1200 can be directly connected or coupled to the rear surface of the display panel 1100 via the connection member 1150 to be supported or disposed at the rear surface of the display panel 1100.

The connection member 1150 according to an embodiment of the present disclosure can be formed of a material including an adhesive layer having excellent adhesion or bonding force with respect to the rear surface of the display panel 1100 and the vibration generating device 1200, respectively. For example, the connection member 1150 can include a foam pad, a double-sided tape, or an adhesive, but embodiments of the present disclosure are not limited thereto. For example, the adhesive layer of the connection member 1150 can include, but embodiments of the present disclosure are not limited to, epoxy, acryl, silicone, or urethane. For example, the adhesive layer of the connection member 1150 can be different from the adhesive layer of the adhesive member 1150. For example, the adhesive layer of the connection member 1150 can include an acryl-based material (or material) having relatively excellent adhesion and high hardness among acrylic and urethane. Accordingly, the vibration of the vibration generating device 1200 can be easily transferred to the display panel 1100.

The connection member 1150 according to another embodiment can further include a hollow portion disposed between the display panel 1100 and the vibration generating device 1200. The hollow portion of the connection member 1150 can provide an air gap between the display panel 1100 and the vibration generating device 1200. The air gap minimizes loss of vibration by the connection member 1150 by allowing sound waves (or sound pressure level) according to the vibration of the vibration generating device 1200 to be concentrated on the display panel 1100 without being dispersed by the connection member 1150. For example, the hollow portion of the connection member 150 can help form a type of resonance chamber behind the display panel. Therefore, the sound pressure level characteristic of the sound generated according to the vibration of the display panel 1100 can be increased.

The apparatus according to an embodiment of the present disclosure can further include a support member 1300 disposed at the rear surface of the display panel 1100.

The support member 1300 can cover the rear surface of the display panel 1100. For example, the support member 1300 can cover the entire rear surface of the display panel 1100 with a gap space GS interposed therebetween. For example, the support member 1300 can include at least one of a glass material, a metal material, and a plastic material. For example, the support member 1300 can be a rear structure, a set structure, a cover bottom, or a back cover, but embodiments of the present disclosure are not limited thereto.

The apparatus according to an embodiment of the present disclosure can further include a middle frame 1400.

The middle frame 1400 can be disposed between a rear edge of the display panel 1100 and a front edge portion of the support member 1300. The middle frame 1400 supports at least one of an edge portion of the display panel 1100 and an edge portion of the support member 1300, respectively, and surrounds at least one of the side surfaces of each of the display panel 1100 and the support member 1300. The middle frame 1400 can provide a gap space GS between the display panel 1100 and the support member 1300.

According to an embodiment of the present disclosure, the middle frame 1400 can be coupled or connected to a rear edge portion of the display panel 1100 via a first frame connection member 1401. The middle frame 1400 can be coupled to or connected to a front edge portion of the support member 1300 via a second frame connection member 1403.

The apparatus according to an embodiment of the present disclosure can include a panel connection member instead of the middle frame 1400. The panel connection member can be disposed between a rear edge portion of the display panel 1100 and a front edge portion of the support member 1300 to provide a gap space GS between the display panel 1100 and the support member 1300. The panel connection member can be disposed between a rear edge portion of the display panel 1100 and an edge portion of the support member 1300 to attach the display panel 1100 and the support member 1300.

As described above, the apparatus (or display apparatus) according to an embodiment of the present disclosure can output sound generated according to the vibration of the display panel 1100 according to the vibration of the vibration generating device 1200 disposed at the rear surface of the display panel 1100 to the front of the display panel 1100 or the apparatus, and concentrate or focus the sound generated according to the vibration of the vibration generating device 1200 in a specific direction to implement a user's privacy security function not allowing a sound to be heard in a surrounding area (or non-hearing area) other than an area (or a hearing area) in the specific direction.

In FIGS. 23 and 24, it is described that the vibration generating device 1200 vibrates the display panel 1100 to generate or output a sound, but embodiments of the present disclosure are not limited thereto. For example, the vibration generating device 1200 can generate another vibration object other than the display panel 1100 among the aforementioned vibration objects to generate or output sound.

Figure 25:
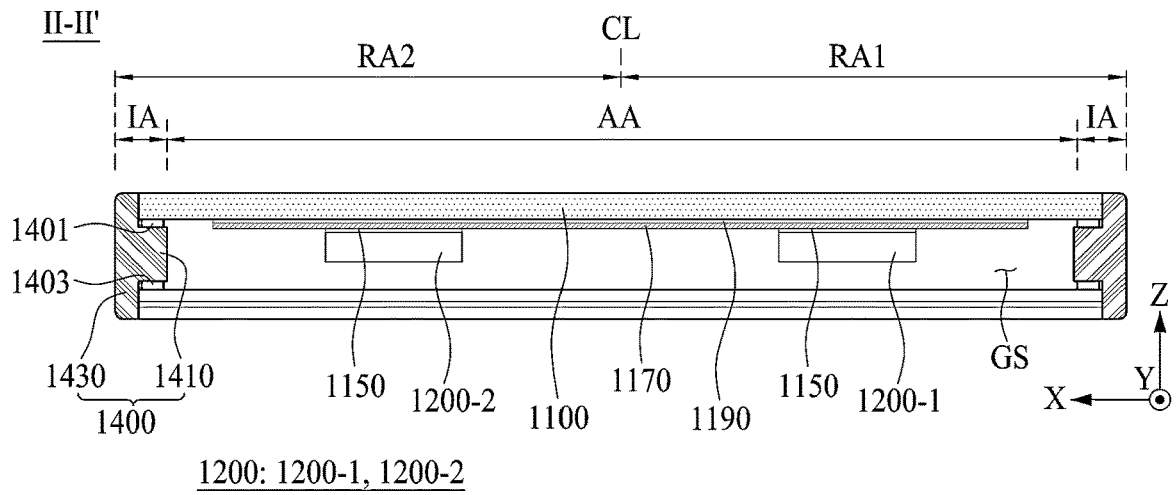
FIG. 25 is another cross-sectional view taken along line II-II' of FIG. 23.

FIG. 25 is another cross-sectional view taken along line II-II' shown in FIG. 23, which is a modification of the vibration generating device shown in FIG. 23. Accordingly, in the following description, descriptions of components other than the vibration generating device and related components are omitted or simplified.

With reference to FIGS. 23 and 25, in an apparatus according to another embodiment of the present disclosure, the display panel 1100 can include a first rear area RA1 and a second rear area RA2 (e.g., for providing stereo sound, and/or localized haptic feedback). For example, the first rear area RA1 can be a right rear area of the display panel 1100, and the second rear area RA2 can be a left rear area of the display panel 1100. The first and second rear areas RA1 and RA2 can be laterally symmetrical with respect to a middle line CL of the display panel 1100 in the first direction X, but embodiments of the present disclosure are not limited thereto. For example, each of the first and second areas RA1 and RA2 can overlap with a display area AA of the display panel 1100.

The vibration generating device 1200 according to another embodiment of the present disclosure can include a first vibration generating device 1200-1 and a second vibration generating device 1200-2.

The first vibration generating device 1200-1 can be disposed in the first rear area RA1 of the display panel 1100. A size of the first vibration generating device 1200-1 can have the same size as the first rear area RA1 or smaller than the first rear area RA1 according to the characteristics of the first sound or acoustic characteristics required for the apparatus. For example, the first vibration generating device 1200-1 can be disposed to be biased toward the center or the edge in the first rear area RA1 of the display panel 1100 based on the first direction X.

According to an embodiment of the present disclosure, the first vibration generating device 1200-1 vibrates the first rear area RA1 of the display panel 1100 to generate at least a first sound among a first vibration sound, a first directional vibration sound, and a first haptic feedback. For example, the first vibration generating device 1200-1 can generate a first sound in the first rear area RA1 of the display panel 1100 by directly vibrating the first rear area RA1 of the display panel 1100. For example, the first sound can be a right sound.

The second vibration generating device 1200-2 can be disposed in the second rear area RA2 of the display panel 1100. A size of the second vibration generating device 1200-2 can have the same size as the second rear area RA2 or smaller than the second rear area RA2 according to the characteristics of a second sound or acoustic characteristics required for the apparatus. For example, the second vibration generating device 1200-2 can be disposed to be biased toward the center or the edge in the second rear area RA2 of the display panel 1100 based on the first direction X.

According to an embodiment of the present disclosure, the second vibration generating device 1200-2 vibrates the second rear area RA2 of the display panel 1100 to generate at least one second sound among a second vibration sound, a second directional vibration sound, and a second haptic feedback. For example, the second vibration generating device 1200-2 can directly vibrate the second rear area RA2 of the display panel 1100 to generate a second sound from the second rear area RA2 of the display panel 1100. For example, the second sound can be a left sound.

The first and second vibration generating devices 1200-1 and 1200-2 can have the same size or different sizes depending on the left and right acoustic characteristics of the apparatus and/or the acoustic characteristics of the apparatus. In addition, the first and second vibration generating devices 1200-1 and 1200-2 can be arranged in a laterally symmetrical or laterally asymmetrical structure based on the middle line CL of the display panel 1100.

Since each of the first vibration generating device 1200-1 and the second vibration generating device 1200-2 can include one or more of the vibration devices described with reference to FIGS. 1 to 42, a redundant description thereof is omitted or may be briefly provided.

Each of the first vibration generating device 1200-1 and the second vibration generating device 1200-2 can be disposed at the rear surface of the display panel 1100 via the connection member 1150. Since the connection member 1150 is substantially the same as the connection member 1150 described with reference to FIG. 24, a redundant description thereof is omitted or may be briefly provided.

An apparatus (or a display apparatus) according to another embodiment of the present disclosure can output a left sound and a right sound through a first vibration generating device 1200-1 and a second vibration generating device 1200-2 to the front of the display panel 1100, and concentrates or focuses the sound generated according to the respective vibrations of the first vibration generating device 1200-1 and the second vibration generating device 1200-2 in a specific direction, thereby implementing a user privacy security function that prevents sound from being heard in a surrounding area (or non-hearing area) other than the area (or the hearing area).

The apparatus according to another embodiment of the present disclosure can further include a plate 1170 disposed between the display panel 1100 and the vibration generating device 1200.

The plate 1170 can have the same shape and size as the rear surface of the display panel 1100 or can have the same shape and size as the vibration generating device 1200. As another example, the plate 1170 can have a size different from that of the display panel 1100. For example, the plate 1170 can be smaller than the size of the display panel 1100. As another example, the plate 1170 can have a size different from that of the vibration generating device 1200. For example, the plate 1170 can be larger or smaller than the size of the vibration generating device 1200. The vibration generating device 1200 can be the same as or smaller than the size of the display panel 1100.

The plate 1170 can be connected to or coupled to the rear surface of the display panel 1100 via the plate coupling member 1190. Accordingly, the vibration generating device 1200 can be connected or coupled to the rear surface of the plate 1170 via the connection member 1150 to be supported or suspended on the rear surface of the plate 1170.

The plate 1170 according to an embodiment of the present disclosure can include a plurality of openings. The plurality of openings can be configured to have a predetermined size and a predetermined interval. For example, the plurality of openings can be formed along the first direction X and the second direction Y to have a constant size and a constant interval. Each of the plurality of openings allows a sound wave (or sound pressure level) according to the vibration of the vibration generating device 1200 to be concentrated on the display panel 1100 without being dispersed by the plate 1170, thereby minimizing loss of vibration by the plate 1170. Accordingly, the sound pressure level characteristic of the sound generated according to the vibration of the display panel 1100 can be increased. For example, the plate 1170 including a plurality of openings can have a mesh shape. For example, the plate 1170 including the plurality of openings can be a mesh plate.

The plate 1170 according to an embodiment of the present disclosure can be formed of a metal material. For example, the plate 1170 can be formed of any one or more of stainless steel, aluminum (Al), a magnesium (Mg), a magnesium (Mg) alloy, a magnesium lithium (Mg—Li) alloy, and an aluminum (Al) alloy, but embodiments of the present disclosure are not limited thereto. Accordingly, the plate 1170 can serve as a heat dissipation plate for dissipating heat generated by the display panel 1100.

According to an embodiment of the present disclosure, the metal plate 1170 can reinforce a mass of the vibration generating device 1200 disposed or suspended on the rear surface of the display panel 1100. Accordingly, the plate 1170 can reduce a resonance frequency of the vibration generating device 1200 according to an increase in the mass of the vibration generating device 1200. Accordingly, the plate 1170 can increase the acoustic characteristics of a low register range and the sound pressure level characteristics of the low register range generated in association with the vibration of the vibration generating device 1200 and improve flatness of the sound pressure level characteristics. Here, the flatness of the acoustic characteristics can be a magnitude of deviation between the highest sound pressure level and the lowest sound pressure level. For example, the plate 1170 can be expressed as a weight member, a mass member, or an acoustic flattening member, but embodiments of the present disclosure are not limited thereto.

Figure 26:
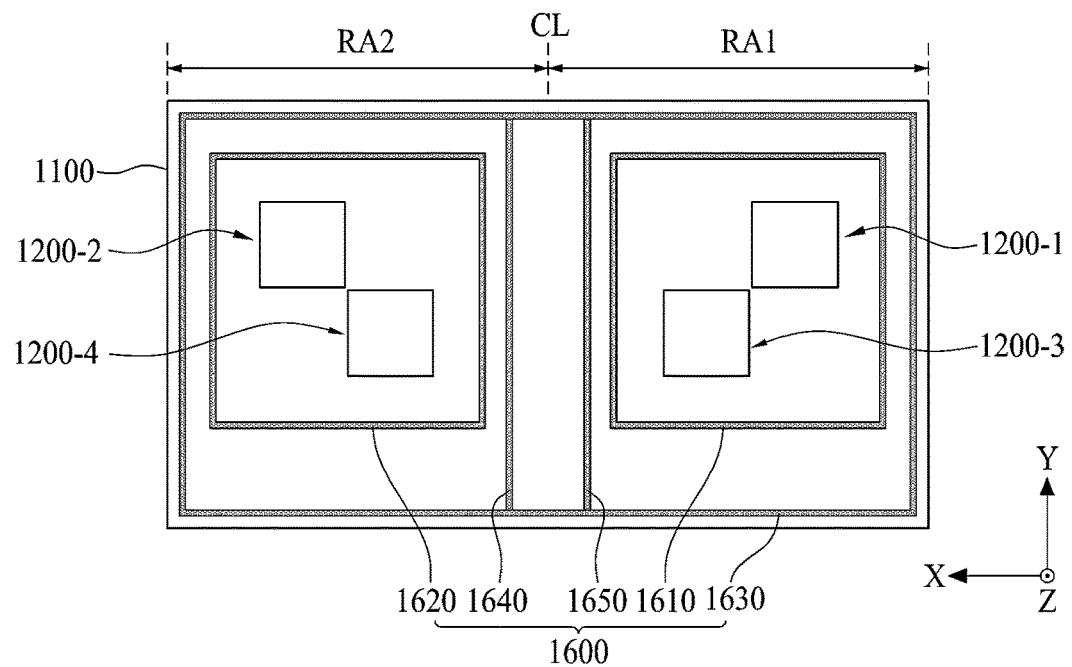
FIG. 26 illustrates an apparatus according to another embodiment of the present disclosure.

FIG. 26 illustrates an apparatus according to another embodiment of the present disclosure. FIG. 26 illustrates a configuration of a partition added to the apparatus shown in FIG. 25. Accordingly, hereinafter, redundant descriptions of components other than the partition and related components are omitted or simplified.

With reference to FIG. 26, the apparatus according to another embodiment of the present disclosure can include the display panel 1100 and the vibration generating device 1200 and can further include a partition 1600 dividing the first and second rear areas RA1 and RA2 of the display panel 1100.

The vibration generating device 1200 can include first to fourth vibration generating devices 1200-1, 1200-2, 1200-3, and 1200-4 disposed at the rear surface of the display panel 1100.

Since each of the first, second, third, and fourth vibration generating devices 1200-1, 1200-2, 1200-3, and 1200-4 can include one or more of the vibration devices described with reference to FIGS. 1 to 22, a redundant description thereof is omitted or may be briefly provided.

Each of the first and third vibration generating devices 1200-1 and 1200-3 is disposed in a direction crossing each other or diagonally in the first rear area RA1 of the display panel 1100, thereby increasing a vibration area for the first rear area RA1 of the display panel 1100. For example, the diagonal direction can be a direction between the first direction X and the second direction Y.

Each of the first and third vibration generating devices 1200-1 and 1200-3 vibrates the first rear area RA1 of the display panel 1100 to thereby generate a first sound (or a right sound) or generate a first haptic feedback in the first rear area RA1 of the display panel 1100. For example, the vibration area of the first rear area RA1 of the display panel 1100 increases according to a diagonal arrangement structure of the first and third vibration generators 1200-1 and 1200-3, so that acoustic characteristics including low register characteristics of the first sound (or the right sound) can be improved. For example, since the third vibration generating device 1200-3, in addition to the first vibration generating device 1200-1, is further disposed, the first sound or first haptic feedback generated in the first rear area RA1 of the display panel 1100 can be further improved compared with the first sound or first haptic feedback of a configuration including only a single vibration generating device.

Each of the second and fourth vibration generating devices 1200-2 and 1200-4 is arranged in a direction crossing each other or diagonally in the second rear area RA2 of the display panel 1100, thereby increasing a vibration area with respect to the second rear area RA2 of the display panel 1100. For example, the diagonal direction can be a direction between the first direction X and the second direction Y.

Each of the second and fourth vibration generating devices 1200-2 and 1200-4 vibrates the second rear area RA2 of the display panel 1100 to thereby generate a second sound (or left sound) or generate a second haptic feedback in the second rear area RA2 of the display panel 1100. For example, the vibration area of the second rear area RA2 of the display panel 1100 increases according to the diagonal arrangement structure of the second and fourth vibration generators 1200-2 and 1200-4, so that acoustic characteristics including low register characteristics of the second sound (or left sound) can be improved. For example, since the fourth vibration generating device 1200-4, in addition to the second vibration generating device 1200-2, is further disposed, the second sound or second haptic feedback generated in the second rear area RA2 of the display panel 1100 can be further improved compared with the second sound or second haptic feedback of a situation of configuring one vibration generating device.

In FIG. 26, each of the first and third vibration generating devices 1200-1 and 1200-3 can be arranged in a parallel structure parallel to each other in the first direction X or the second direction Y. Accordingly, the first sound or the first haptic feedback generated in the first rear area RA1 of the display panel 1100 can be further improved, compared with the first sound or the first haptic feedback described above in FIG. 25, according to the parallel arrangement structure of the first and third vibration generating devices 1200-1 and 1200-3.

In FIG. 26, each of the second and fourth vibration generating devices 1200-2 and 1200-4 can be arranged in a parallel structure parallel to each other in the first direction X or the second direction Y. Accordingly, the second sound or the second haptic feedback generated in the second rear area RA2 of the display panel 1100 can be further improved, compared with the second sound or the second haptic feedback of the situation of configuring one vibration generating device, due to the parallel arrangement structure of the second and fourth vibration generating devices 1200-2 and 1200-4.

The partition 1600 according to an embodiment of the present disclosure can spatially divide the first and second rear areas RA1 and RA2 of the display panel 1100.

The partition 1600 can be an air gap or a space in which sound is generated in each of the first and second rear regions RA1 and RA2 when the display panel 1100 is vibrated by the vibration generating device 1200. For example, the partition 1600 can separate the sound generated in each of the first and second rear areas RA1 and RA2 or separate channels and prevent or reduce deterioration of the characteristics of the sound due to interference of sound generated in each of the first and second rear areas RA1 and RA2. The partition 1600 can be expressed as a sound blocking member, a sound separating member, a space separating member, an enclosure, or a baffle, but embodiments of the present disclosure are not limited thereto.

The partition 1600 according to an embodiment of the present disclosure can be disposed between the display panel 1100 and the support member 1300 (refer to FIG. 24) and spatially divide and the first and second rear areas RA1 and RA2 of the display panel 1100. Also, the partition 1600 can block or minimize acoustic interference between the first and second rear areas RA1 and RA2.

The partition 1600 according to an embodiment of the present disclosure can be formed of a material having elasticity that can be compressed to a certain degree. For example, the partition 1600 can be formed of a polyurethane or polyolefin material, but embodiments of the present disclosure are not limited thereto. As another example, the partition 1600 can be formed of a single-sided tape, a single-sided foam tape, a double-sided tape, or a double-sided foam tape.

The partition 1600 according to an embodiment of the present disclosure can include first and second partition members 1610 and 1620.

The first partition member 1610 can be disposed between the display panel 1100 corresponding to the first rear area RA1 and the support member 1300. The first partition member 1610 can entirely surround the first and third vibration generating devices 1200-1 and 1200-3. The first partition member 1610 can have a rectangular shape, a circular shape, or an elliptical shape surrounding the first and third vibration generating devices 1200-1 and 1200-3, but embodiments of the present disclosure are not limited thereto.

The second partition member 1620 can be disposed between the display panel 1100 corresponding to the second rear area RA2 and the support member 1300. The second partition member 1620 can entirely surround the second and fourth vibration generating devices 1200-2 and 1200-4. The second partition member 1620 can have a rectangular shape, a circular shape, or an elliptical shape surrounding the second and fourth vibration generating devices 1200-2 and 1200-4, but embodiments of the present disclosure are not limited thereto.

According to an embodiment of the present disclosure, the first and second partition members 1610 and 1620 can have the same or different shapes. For example, each of the first and second partition members 1610 and 1620 can have a rectangular shape. For example, the first partition member 1610 can have a rectangular ring shape, and the second partition member 1620 can have a circular ring shape or an elliptical ring shape.

In the apparatus according to another embodiment of the present disclosure, sound output characteristics can be further improved by separating left and right sounds by the first and second partition members 1610 and 1620, and sound of two or more channels can be output to the front of the display panel 1100 due to the separation of the left and right sounds. For example, the first and second partition members 1610, 1620 can help isolate vibrations and keep them localized near their respective origination points, in order to provide more precise haptic feedbacks to the user and/or improved stereo sound.

The partition 1600 according to an embodiment of the present disclosure can further include a third partition member 1630 disposed between the display panel 1100 and the support member 1300.

The third partition member 1630 can be disposed between the rear edge of the display panel 1100 and the front edge of the support member 1300. The third partition member 1630 can be disposed to surround the entire vibration generating device 1200. The third partition member 1630 can be expressed as an edge partition, a sound blocking member, an edge enclosure, or an edge baffle, but embodiments of the present disclosure are not limited thereto. For example, the third partition member 1630 can be disposed adjacent to or in contact with the aforementioned middle frame 1400 and can be surrounded by the middle frame 1400. As another example, the third partition member 1630 can be implemented as one body with the middle frame 1400.

According to an embodiment of the present disclosure, the third partition member 1630 can be implemented with the same material as that of at least one of the first and second partition members 1610 and 1620.

The partition 1600 according to an embodiment of the present disclosure can further include a fourth partition member 1640 and a fifth partition member 1650.

The fourth partition member 1640 and the fifth partition member 1650 can be disposed between the display panel 1100 and the support member 1300. For example, the fourth partition member 1640 and the fifth partition member 1650 can be disposed in a middle area of the display panel 1100. For example, the fourth partition member 1640 and the fifth partition member 1650 can be disposed parallel to each other in the middle area of the display panel 1100. The fourth partition member 1640 and the fifth partition member 1650 can be disposed at a rear middle line CL of the display panel 1100 and divide the first rear area RA1 and the second rear area RA2 of the display panel 1100. For example, the fourth partition member 1640 and the fifth partition member 1650 can spatially divide the first rear area RA1 and the second rear area RA2 of the display panel 1100. Accordingly, the fourth partition member 1640 and the fifth partition member 1650 can block or minimize acoustic interference between the first and second rear areas RA1 and RA2. Accordingly, in the apparatus according to another embodiment of the present disclosure, sound output characteristics can be further improved by separating left and right sounds by the fourth and fifth partition members 1640 and 1650, and sounds including two or more channels can be output to the front of the display panel 1100 by separating the left and right sounds.

According to an embodiment of the present disclosure, the fourth and fifth partition members 1640 and 1650 can be implemented with the same material as that of at least one of the first to third partition members 1610, 1620, and 1630.

According to an embodiment of the present disclosure, any one of the fourth partition member 1640 and the fifth partition member 1650 can be omitted. For example, when the fifth partition member 1650, among the fourth partition member 1640 and the fifth partition member 1650, is omitted, the fourth partition member 1640 can be disposed between the display panel 1100 and the support member 1300 to correspond to the rear middle line (CL) of the display panel 1100. Even if any one of the fourth partition member 1640 and the fifth partition member 1650 is omitted, left and right sounds can be separated.

Accordingly, the apparatus according to another embodiment of the present disclosure can optimize the sound pressure level characteristics and reproduction sound range of each of the left and right sounds by including the partition 1600. As an example, the apparatus according to another embodiment of the present disclosure can include at least one or more of the first to fifth partition members 1610, 1620, 1630, 1640, and 1650.

An apparatus according to an embodiment of the present disclosure can be applied to all apparatuses and/or electronic apparatuses using a display panel or a vibration object as an acoustic diaphragm. For example, the apparatus according to an embodiment of the present disclosure can include a mobile apparatus, a video phone, a smart watch, a watch phone, a wearable apparatus, a foldable apparatus, a rollable apparatus, a bendable apparatus, a flexible apparatus, a curved apparatus, a sliding apparatus, an electronic notebook, e-book, a portable multimedia player (PMP), a personal digital assistant (PDA), an MP3 player, a mobile medical apparatus, a desktop PC, a laptop PC, a netbook computer, a workstation, a GPS navigation, a GPS vehicle navigation, a vehicle display apparatus, a television, a wall paper display apparatus, a signage apparatus, a game apparatus, a notebook, a monitor, a camera, a camcorder, a home appliance, and the like. Also, the vibration device of the present disclosure can be applied to a light emitting diode lighting apparatus, an organic light emitting lighting apparatus, or an inorganic light emitting lighting apparatus. When the vibration device is applied to a lighting apparatus, the vibration device can serve as a lighting and a speaker. Also, when the vibration device of the present disclosure is applied to a mobile apparatus, it can be at least one of a speaker, a receiver, and a haptic, but embodiments of the present disclosure are not limited thereto. As another example, the vibration device of the present disclosure can be applied to a non-display apparatus or a vibration object other than a display apparatus. For example, when the vibration device is applied to a non-display apparatus or a vibration object other than a display apparatus, it can be a speaker for a vehicle or a speaker implemented together with lighting, but embodiments of the present disclosure are not limited thereto.

A vibration device and apparatus according to an embodiment of the present disclosure can be described as follows.

A vibration device according to an embodiment of the present disclosure includes a vibration portion, a first electrode portion disposed at a first surface of the vibration portion, and a second electrode portion disposed at a second surface of the vibration portion, in which each of the first electrode portion and the second electrode portion includes at least one of a conductive metal particle and a carbon particle.

According to some embodiments of the present disclosure, the first electrode portion and the second electrode portion can be each configured as a single layer, and each of the first electrode portion and the second electrode portion can include a conductive metal nanoparticle.

According to some embodiments of the present disclosure, the conductive metal nanoparticle can include at least one or more of silver (Ag), gold (Au), platinum (Pt), and copper (Cu).

According to some embodiments of the present disclosure, the conductive metal nanoparticle can have a particle size less than or equal to 1 μm.

According to some embodiments of the present disclosure, the first electrode portion can include a first layer disposed adjacent to the vibration portion, and a second layer disposed at the first layer, in which the first layer can include a carbon particle, and the second layer can include a conductive metal flake particle.

According to some embodiments of the present disclosure, the conductive metal flake particle can include at least one or more of silver (Ag), gold (Au), platinum (Pt), and copper (Cu).

According to some embodiments of the present disclosure, the conductive metal flake particle can have a particle size of 1 μm to 10 μm (e.g., 5 μm).

According to some embodiments of the present disclosure, the carbon particle can include at least one of a carbon nanoparticle and a carbon flake particle.

According to some embodiments of the present disclosure, the carbon nanoparticle can have a size of 10 nm to 500 nm or 150 nm to 350 nm, and the carbon flake particle can have a particle size of 1 μm to 10 μm (e.g., 5 μm).

According to some embodiments of the present disclosure, the second electrode portion can include a first layer disposed adjacent to the vibration portion, and a second layer disposed at the first layer, in which the first layer can include a carbon particle, and the second layer includes a conductive metal flake particle.

According to some embodiments of the present disclosure, the conductive metal flake particle can include at least one or more of silver (Ag), gold (Au), platinum (Pt), and copper (Cu).

According to some embodiments of the present disclosure, the conductive metal flake particle can have a particle size of 1 μm to 10 μm (e.g., 5 μm).

According to some embodiments of the present disclosure, the carbon particle can include at least one of carbon nanoparticle and carbon flake particle.

According to some embodiments of the present disclosure, the carbon nanoparticle can have a size of 10 nm to 500 nm or 150 nm to 350 nm, and the carbon flake particle can have a particle size of 1 μm to 10 μm (e.g., 5 μm).

According to some embodiments of the present disclosure, the vibration portion can include a plurality of inorganic vibration portions, each of the plurality of inorganic vibration portions including a piezoelectric material, and an organic vibration portion between at least two of the plurality of inorganic vibration portions.

According to some embodiments of the present disclosure, the organic vibration portion can include at least one of an organic material, an organic polymer, an organic piezoelectric material, and an organic non-piezoelectric material.

According to some embodiments of the present disclosure, the first electrode portion and the second electrode portion can each be configured as a single layer, and each of the first electrode portion and the second electrode portion can include a conductive metal nanoparticle and a piezoelectric nanoparticle.

According to some embodiments of the present disclosure, the piezoelectric nanoparticle can include a same material as the inorganic vibration portion, and the piezoelectric nanoparticle can have a particle size less than 1 μm.

According to some embodiments of the present disclosure, the conductive metal nanoparticle can include at least one or more of silver (Ag), gold (Au), platinum (Pt), and copper (Cu), and the conductive metal nanoparticle can have a particle size less than or equal to 1 μm.

According to some embodiments of the present disclosure, the first electrode portion can include a first layer disposed adjacent to the vibration portion, and a second layer disposed at the first layer, in which the first layer includes a carbon particle and a piezoelectric nanoparticle, and the second layer includes a conductive metal flake particle.

According to some embodiments of the present disclosure, the piezoelectric nanoparticle can include a same material as the inorganic vibration portion, and the piezoelectric nanoparticle have a particle size less than 1 μm.

According to some embodiments of the present disclosure, the conductive metal flake particle can include at least one or more of silver (Ag), gold (Au), platinum (Pt), and copper (Cu), and the conductive metal flake particle have a particle size 1 μm to 10 μm.

According to some embodiments of the present disclosure, the carbon particle can include at least one of carbon nanoparticle and carbon flake particle, the carbon nanoparticle have a size of 10 nm to 500 nm or 150 nm to 350 nm, and the carbon flake particle have a particle size of 1 μm to 10 μm (e.g., 5 μm).

According to some embodiments of the present disclosure, the second electrode portion can include a first layer disposed adjacent to the vibration portion, and a second layer disposed at the first layer, in which the first layer includes a carbon particle and a piezoelectric nanoparticle, and the second layer includes a conductive metal flake particle.

According to some embodiments of the present disclosure, the piezoelectric nanoparticle can include a same material as the inorganic vibration portion, and the piezoelectric nanoparticle have a particle size less than 1 μm.

According to some embodiments of the present disclosure, the conductive metal flake particle can include at least one or more of silver (Ag), gold (Au), platinum (Pt), and copper (Cu), and the conductive metal flake particle have a particle size 1 μm to 10 μm.

According to some embodiments of the present disclosure, the carbon particle can include at least one of a carbon nanoparticle and a carbon flake particle, the carbon nanoparticle have a size of 10 nm to 500 nm or 150 nm to 350 nm (e.g., 250 nm), and the carbon flake particle have a particle size of 1 μm to 10 μm (e.g., 5 μm).

According to some embodiments of the present disclosure, at least one of the first layer of the first electrode portion and the first layer of the second electrode portion may include a first portion overlapping with the inorganic electrode portion and a second portion overlapping with the organic vibration portion, in which the first portion may include at least one of a carbon particle and a piezoelectric nanoparticle, and in which the second portion may include at least one of an organic material, an organic polymer, an organic piezoelectric material, and an organic non-piezoelectric material. According to some embodiments of the present disclosure, the first layer of the first electrode portion can include a first portion overlapping with the inorganic electrode portion, and a second portion overlapping with the organic vibration portion, in which the first portion can include at least one of a carbon particle and a piezoelectric nanoparticle, and the second portion can include at least one of an organic material, an organic polymer, an organic piezoelectric material, and an organic non-piezoelectric material.

According to some embodiments of the present disclosure, the first layer of the second electrode portion can include a first portion overlapping with the inorganic electrode portion, and a second portion overlapping with the organic vibration portion, in which the first portion include at least one of a carbon particle and a piezoelectric nanoparticle, and the second portion can include at least one of an organic material, an organic polymer, an organic piezoelectric material, and an organic non-piezoelectric material.

According to some embodiments of the present disclosure, the vibration device can further include a first protective member disposed at the first surface of the vibration portion, and a second protective member disposed at the second surface of the vibration portion.

A vibration device according to an embodiment of the present disclosure includes a first electrode portion, a first vibration portion disposed at a rear surface of the first electrode portion, a third electrode portion disposed at a rear surface of the first vibration portion, a second vibration portion disposed at a rear surface of the third electrode portion, and a second electrode portion disposed at a rear surface of the second vibration portion, in which the first vibration portion and the second vibration portion have mutually opposite poling directions.

According to some embodiments of the present disclosure, the first electrode portion can include a first layer disposed adjacent to a front surface of the first vibration portion, and a second layer disposed at the first layer, in which the first layer includes a carbon particle, and the second layer includes a conductive metal flake particle.

According to some embodiments of the present disclosure, the second electrode portion can include a first layer disposed adjacent to the front surface of the first vibration portion, and a second layer disposed at the first layer, in which the first layer includes a carbon particle, and the second layer includes a conductive metal flake particle.

According to some embodiments of the present disclosure, the third electrode portion can include a first layer disposed adjacent to the rear surface of the first vibration portion, a third layer disposed adjacent to a front surface of the second vibration portion, and second layer disposed between the first layer and the third layer, in which the first layer and the third layer can include a carbon particle, and the second layer includes a conductive metal flake particle.

According to some embodiments of the present disclosure, the vibration portion can include a plurality of inorganic vibration portions, each of the plurality of inorganic vibration portions including a piezoelectric material, and an organic vibration portion between two of the plurality of inorganic vibration portions.

According to some embodiments of the present disclosure, the organic vibration portion can include at least one of an organic material, an organic polymer, an organic piezoelectric material, and an organic non-piezoelectric material.

According to some embodiments of the present disclosure, the vibration device can further include a first protective member disposed at a front surface of the vibration device, and a second protective member disposed at a rear surface of the vibration device.

An apparatus according to an embodiment of the present disclosure includes a vibration object, and a vibration generating device disposed at one surface of the vibration object, in which the vibration generating device includes a vibration device, in which the vibration device includes a vibration portion, a first electrode portion disposed at a first surface of the vibration portion, and a second electrode portion disposed at a second surface of the vibration portion, in which the first electrode portion and the second electrode portion includes at least one of a conductive metal particle and a carbon particle.

According to some embodiments of the present disclosure, the vibration object can be one or more of a display panel having pixels configured to display an image, a screen panel on which an image is projected from a display apparatus, a lighting panel, a vibrating plate, wood, plastic, glass, cloth, an interior material of a vehicle, a glass window of a vehicle, an interior ceiling of a building, a glass window of a building, an interior material of aircraft, and a glass window of aircraft.

An apparatus according to an embodiment of the present disclosure can generate a sound by vibrating the display panel, and can output a sound having an improved sound pressure level characteristic to the front of the display panel.

In the apparatus according to an embodiment of the present disclosure, characteristics of middle register, low register, and/or middle-low register of sounds generated according to displacement of a display panel or a vibration object according to an increase in amplitude displacement of the display panel can be improved.

A vibration device according to an embodiment of the present disclosure can improve the characteristics of the low register, middle-low register, middle register, and high register of sounds generated according to displacement of a vibration plate.

It will be apparent to those skilled in the art that various modifications and variations may be made in the present disclosure without departing from the technical idea or scope of the disclosures. Thus, it is intended that embodiments of the present disclosure cover the modifications and variations of the disclosure provided they come within the scope of the appended claims and their equivalents.

What is claimed is:

1. A vibration device, comprising:
a vibration portion;
a first electrode portion disposed on a first surface of the vibration portion; and
a second electrode portion disposed on a second surface of the vibration portion,
wherein each of the first electrode portion and the second electrode portion includes a conductive metal particle and a piezoelectric nanoparticle.

2. The vibration device of claim 1, wherein the vibration portion includes:
a plurality of inorganic vibration portions, each of the plurality of inorganic vibration portions including a piezoelectric material; and
an organic vibration portion disposed between at least two of the plurality of inorganic vibration portions.

3. The vibration device of claim 2, wherein the piezoelectric nanoparticle includes a same material as the inorganic vibration portion, and
wherein the piezoelectric nanoparticle has a particle size less than 1 µm.

4. The vibration device of claim 1, wherein the conductive metal particle includes at least one or more of silver (Ag), gold (Au), platinum (Pt), and copper (Cu), and
wherein the conductive metal particle has a particle size less than or equal to 1 µm.

5. The vibration device of claim 1, wherein each of the first electrode portion and the second electrode portion is configured as a single layer.

6. The vibration device of claim 1, wherein the conductive metal particle includes one of a conductive metal particle and a conductive metal flake particle.

7. The vibration device of claim 1, further comprising:
a first protective member disposed on the first surface of the vibration portion; and
a second protective member disposed on the second surface of the vibration portion.

8. An apparatus, comprising:
a vibration object; and
a vibration generating device disposed on one surface of the vibration object,
wherein the vibration generating device includes the vibration device of claim 1.

9. The apparatus of claim 8, wherein the vibration object includes at least one or more of a display panel having pixels configured to display an image, a screen panel on which an image is projected from a display apparatus, a lighting panel, a vibrating plate, wood, plastic, glass, cloth, an interior material of a vehicle, a glass window of a vehicle, an interior ceiling of a building, a glass window of a building, an interior material of aircraft, and a glass window of aircraft.

10. A vibration device, comprising:
a vibration portion;
a first electrode portion disposed on a first surface of the vibration portion; and
a second electrode portion disposed on a second surface of the vibration portion,
wherein at least one of the first electrode portion and the second electrode portion includes:
a first layer disposed adjacent to the vibration portion, the first layer including a carbon particle and a piezoelectric nanoparticle; and
a second layer disposed on the first layer, the second layer including a conductive metal flake particle.

11. The vibration device of claim 10, wherein the conductive metal flake particle includes at least one or more of silver (Ag), gold (Au), platinum (Pt), and copper (Cu).

12. The vibration device of claim 10, wherein the conductive metal flake particle has a particle size of 1 μm to 10 μm.

13. The vibration device of claim 10, wherein the carbon particle includes at least one of a carbon nanoparticle and a carbon flake particle.

14. The vibration device of claim 10, wherein a thickness of the second layer is thicker than a thickness of the first layer.

15. The vibration device of claim 10, wherein the second layer covers the first layer.

16. The vibration device of claim 10, wherein the vibration portion includes:
a plurality of inorganic vibration portions, each of the plurality of inorganic vibration portions including a piezoelectric material; and
an organic vibration portion disposed between at least two of the plurality of inorganic vibration portions.

17. The vibration device of claim 10, further comprising a piezoelectric nanoparticle.

18. The vibration device of claim 17, wherein the vibration portion includes:
a plurality of inorganic vibration portions, each of the plurality of inorganic vibration portions including a piezoelectric material; and
an organic vibration portion disposed between at least two of the plurality of inorganic vibration portions,
wherein the piezoelectric nanoparticle includes a same material as the inorganic vibration portion.

19. The vibration device of claim 10, further comprising:
a first protective member disposed on the first surface of the vibration portion; and
a second protective member disposed on the second surface of the vibration portion.

20. An apparatus, comprising:
a vibration object; and
a vibration generating device disposed on one surface of the vibration object,
wherein the vibration generating device includes the vibration device of claim 8.

21. The apparatus of claim 20, wherein the vibration object includes at least one or more of a display panel having pixels configured to display an image, a screen panel on which an image is projected from a display apparatus, a lighting panel, a vibrating plate, wood, plastic, glass, cloth, an interior material of a vehicle, a glass window of a vehicle, an interior ceiling of a building, a glass window of a building, an interior material of aircraft, and a glass window of aircraft.

22. A vibration device, comprising:
a vibration portion;
a first electrode portion disposed on a first surface of the vibration portion; and
a second electrode portion disposed on a second surface of the vibration portion,
wherein at least one of the first electrode portion and the second electrode portion includes:
a first layer disposed including a plurality of first portions spaced apart from each other and a second portion filling a space between the first portions; and
a second layer disposed on the first layer,
wherein the first layer includes a carbon particle and a piezoelectric nanoparticle.

23. The vibration device of claim 22, wherein the carbon particle includes at least one of a carbon nanoparticle and a carbon flake particle.

24. The vibration device of claim 22, wherein the second layer includes a conductive metal flake particle.

25. The vibration device of claim 24, wherein the conductive metal flake particle includes at least one or more of silver (Ag), gold (Au), platinum (Pt), and copper (Cu).

26. The vibration device of claim 22, wherein the vibration portion includes:
a plurality of inorganic vibration portions, each of the plurality of inorganic vibration portions including a piezoelectric material; and
an organic vibration portion disposed between at least two of the plurality of inorganic vibration portions,
wherein the piezoelectric nanoparticle includes a same material as the inorganic vibration portion.

27. The vibration device of claim 22, further comprising:
a first protective member disposed on the first surface of the vibration portion; and
a second protective member disposed on the second surface of the vibration portion.

28. An apparatus, comprising:
a vibration object; and
a vibration generating device disposed on one surface of the vibration object,
wherein the vibration generating device includes the vibration device of claim 22.

29. The apparatus of claim 28, wherein the vibration object includes at least one or more of a display panel having pixels configured to display an image, a screen panel on which an image is projected from a display apparatus, a lighting panel, a vibrating plate, wood, plastic, glass, cloth, an interior material of a vehicle, a glass window of a vehicle, an interior ceiling of a building, a glass window of a building, an interior material of aircraft, and a glass window of aircraft.

30. A vibration device, comprising:
a first electrode portion;
a first vibration portion disposed on a rear surface of the first electrode portion;
a third electrode portion disposed on a rear surface of the first vibration portion;
a second vibration portion disposed on a rear surface of the third electrode portion; and
a second electrode portion disposed on a rear surface of the second vibration portion,
wherein the first vibration portion and the second vibration portion have mutually opposite poling directions, and
wherein at least one of the first electrode portion and the second electrode portion includes:
a first layer disposed adjacent to a front surface of the first vibration portion, the first layer including a carbon particle and a piezoelectric nanoparticle; and
a second layer disposed on the first layer, the second layer including a conductive metal flake particle.

31. The vibration device of claim 30, wherein the third electrode portion includes:
a first layer disposed adjacent to the rear surface of the first vibration portion;
a third layer disposed adjacent to a front surface of the second vibration portion; and
a second layer disposed between the first layer and the third layer,
wherein each of the first layer and the third layer includes a carbon particle, and
wherein the second layer includes a conductive metal flake particle.

32. The vibration device of claim 31, wherein a thickness of the first layer of the third electrode portion and a thickness of the third layer of the third electrode portion are the same as a thickness of the first layer of the first electrode portion and a thickness of the first layer of the second electrode portion.

33. The vibration device of claim 31, wherein a thickness of the second layer of the third electrode portion is the same as a thickness of the second layer of the first electrode portion and a thickness of the second layer of the second electrode portion.

34. The vibration device of claim 31, wherein a thickness of the second layer of the third electrode portion is thicker than a thickness of the first layer of the third electrode portion and a thickness of the third layer of the third electrode portion.

35. The vibration device of claim 30, wherein the vibration portion includes:
a plurality of inorganic vibration portions, each of the plurality of inorganic vibration portions including a piezoelectric material; and
an organic vibration portion disposed between two of the plurality of inorganic vibration portions.

36. The vibration device of claim 35, wherein the organic vibration portion includes at least one of an organic material, an organic polymer, an organic piezoelectric material, and an organic non-piezoelectric material.

37. The vibration device of claim 30, further comprising:
a first protective member disposed on the first electrode; and
a second protective member disposed on the second electrode.

38. An apparatus, comprising:
a vibration object; and
a vibration generating device disposed on one surface of the vibration object,
wherein the vibration generating device includes the vibration device of claim 30.

39. The apparatus of claim 38, wherein the vibration object includes at least one or more of a display panel having pixels configured to display an image, a screen panel on which an image is projected from a display apparatus, a lighting panel, a vibrating plate, wood, plastic, glass, cloth, an interior material of a vehicle, a glass window of a vehicle, an interior ceiling of a building, a glass window of a building, an interior material of aircraft, and a glass window of aircraft.

* * * * *